(12) United States Patent
Kim et al.

(10) Patent No.: US 11,217,766 B2
(45) Date of Patent: Jan. 4, 2022

(54) DISPLAY COVER SUBSTRATE AND DISPLAY DEVICE INCLUDING SAME

(71) Applicant: LG INNOTEK CO., LTD., Seoul (KR)

(72) Inventors: Jong Sun Kim, Seoul (KR); Duck Hoon Park, Seoul (KR); Jae Seok Park, Seoul (KR); Jun Sik Shin, Seoul (KR); Yu Lim Choe, Seoul (KR); Yu Mi Han, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 455 days.

(21) Appl. No.: 16/470,089

(22) PCT Filed: Dec. 13, 2017

(86) PCT No.: PCT/KR2017/014666
§ 371 (c)(1),
(2) Date: Jun. 14, 2019

(87) PCT Pub. No.: WO2018/110984
PCT Pub. Date: Jun. 21, 2018

(65) Prior Publication Data
US 2020/0091456 A1  Mar. 19, 2020

(30) Foreign Application Priority Data

Dec. 16, 2016 (KR) .................. 10-2016-0172302
Feb. 8, 2017 (KR) .................. 10-2017-0017425

(51) Int. Cl.
*H01L 51/52* (2006.01)
*G06F 3/044* (2006.01)

(52) U.S. Cl.
CPC .......... *H01L 51/524* (2013.01); *G06F 3/0443* (2019.05); *H01L 2251/303* (2013.01); *H01L 2251/5338* (2013.01); *H01L 2251/558* (2013.01)

(58) Field of Classification Search
CPC ..................................................... B32B 27/06
See application file for complete search history.

(56) References Cited

U.S. PATENT DOCUMENTS

2003/0100235 A1  5/2003 Kittler, Jr.
2006/0154089 A1  7/2006 Jung
(Continued)

FOREIGN PATENT DOCUMENTS

KR   10-2004-0055052 A   6/2004
KR   10-2007-0101001 A   10/2007
(Continued)

OTHER PUBLICATIONS

International Search Report (PCT/ISA/210) issued in PCT/KR2017/014666, dated Apr. 11, 2018.

*Primary Examiner* — Ian A Rummel
(74) *Attorney, Agent, or Firm* — Birch, Stewart, Kolasch & Birch, LLP

(57) ABSTRACT

A display cover substrate according to an embodiment includes: a flexible substrate including one surface and the other surface opposite to the one surface; a surface reinforcing layer disposed on the one surface; and a functional layer disposed on the surface reinforcing layer, wherein the functional layer includes a plurality of layers having different refractive indexes, and an average light transmittance is 90% or more in a light wavelength band of 388 nm to 700 nm, and an average light transmittance is less than 90% and a minimum light transmittance is 60% or less in a light wavelength band of 250 nm to 388 nm.

20 Claims, 14 Drawing Sheets

(56) References Cited

U.S. PATENT DOCUMENTS

| | | |
|---|---|---|
| 2016/0185926 A1 | 6/2016 | Song et al. |
| 2016/0271914 A1 | 9/2016 | Xie |
| 2016/0342254 A1 | 11/2016 | Motohashi et al. |

FOREIGN PATENT DOCUMENTS

| | | |
|---|---|---|
| KR | 10-2012-0060995 A | 6/2012 |
| KR | 10-2013-0098774 A | 9/2013 |
| KR | 10-2016-0006585 A | 1/2016 |
| KR | 10-2016-0079549 A | 7/2016 |
| KR | 10-2016-0103681 A | 9/2016 |
| KR | 10-2016-0111597 A | 9/2016 |
| KR | 10-2016-0119783 A | 10/2016 |
| WO | WO 2014/188831 A1 | 11/2014 |
| WO | WO 2016/148141 A1 | 9/2016 |

[Fig. 1]
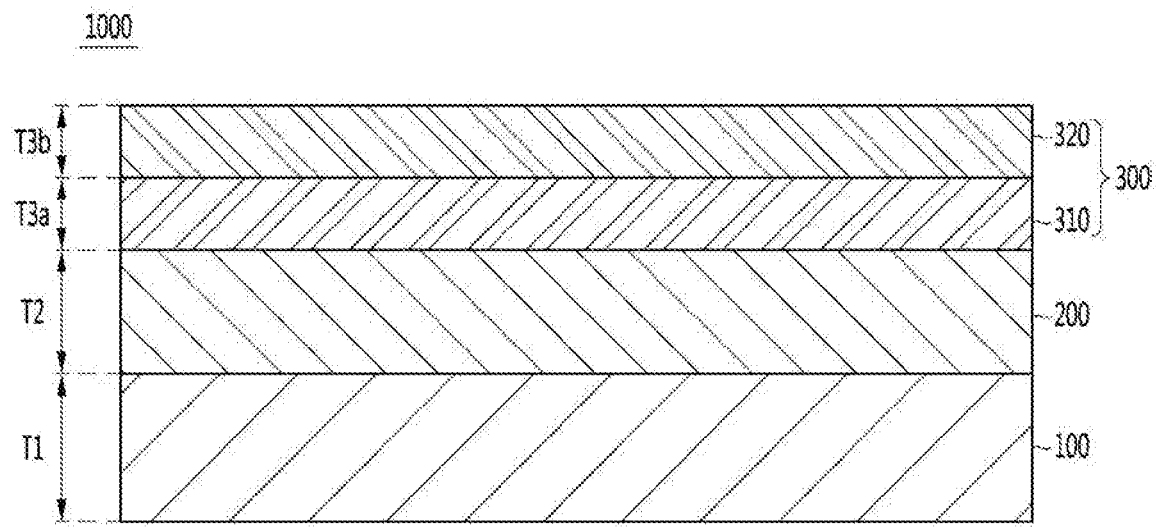
[Fig. 2]
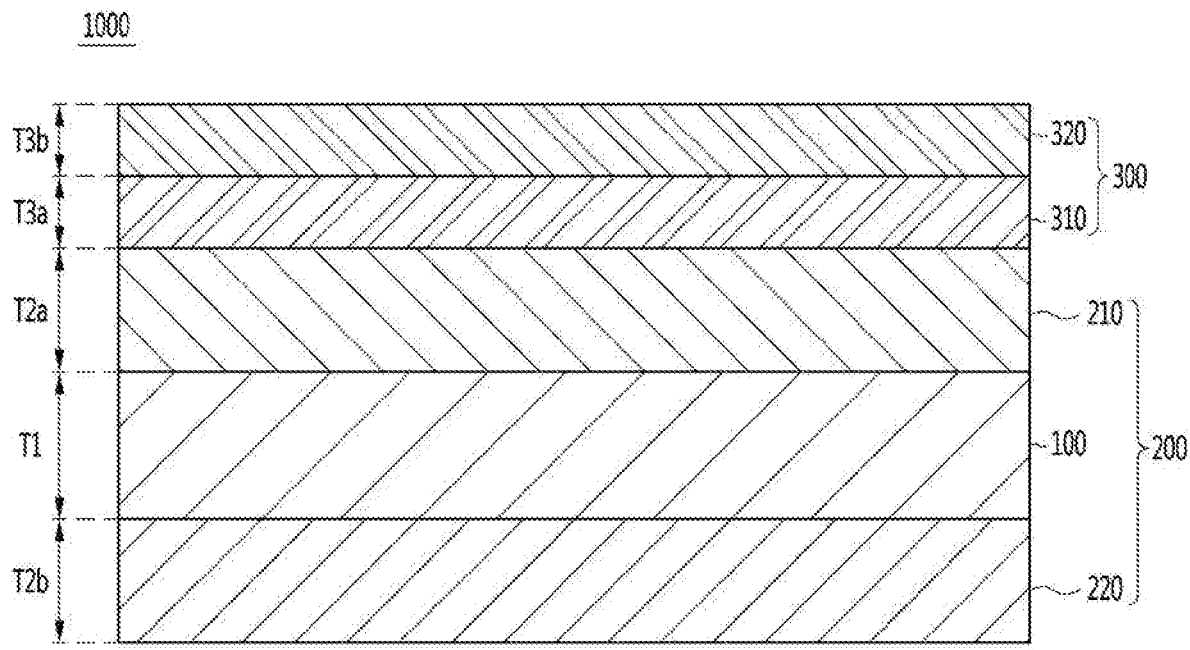

[Fig. 3]
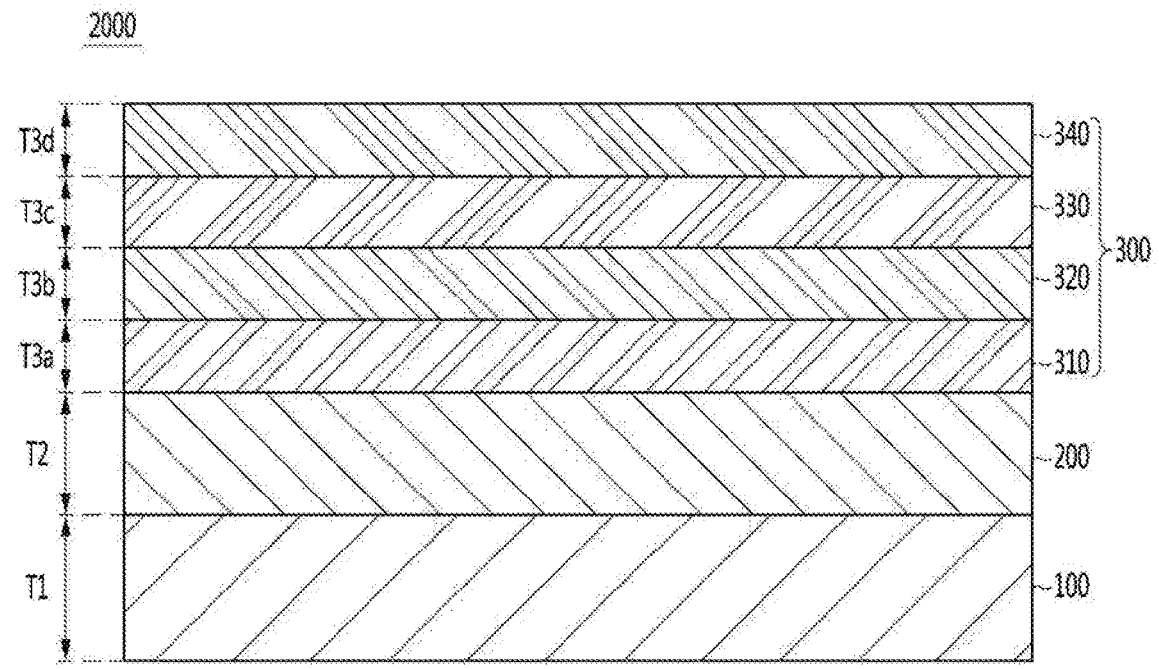
[Fig. 4]
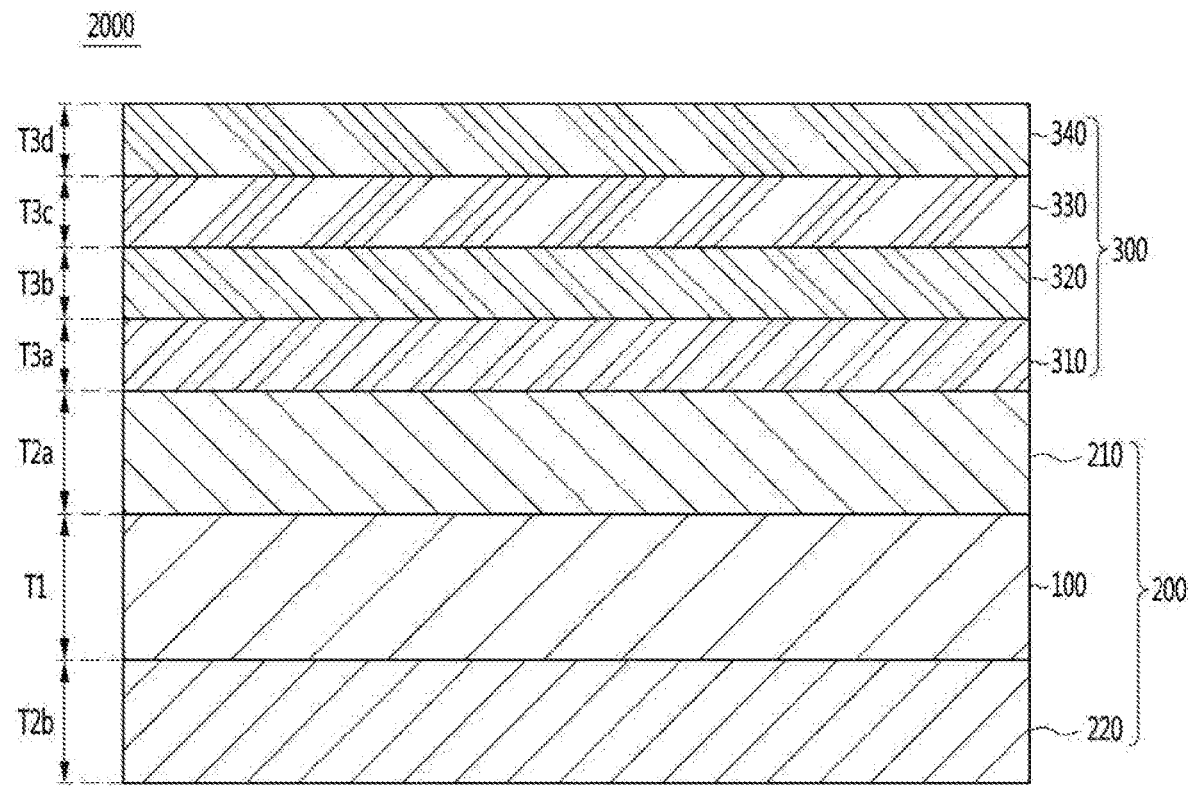

[Fig. 5]
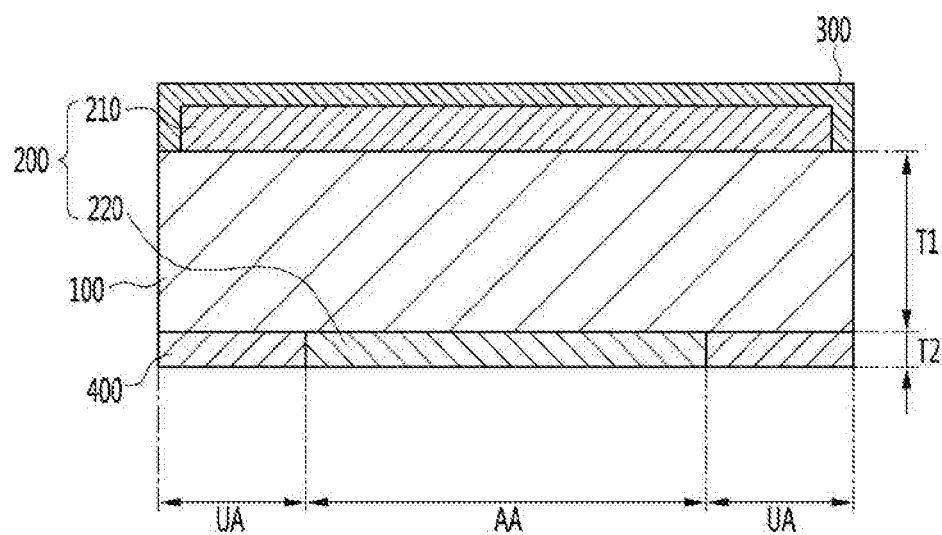

[Fig. 6]
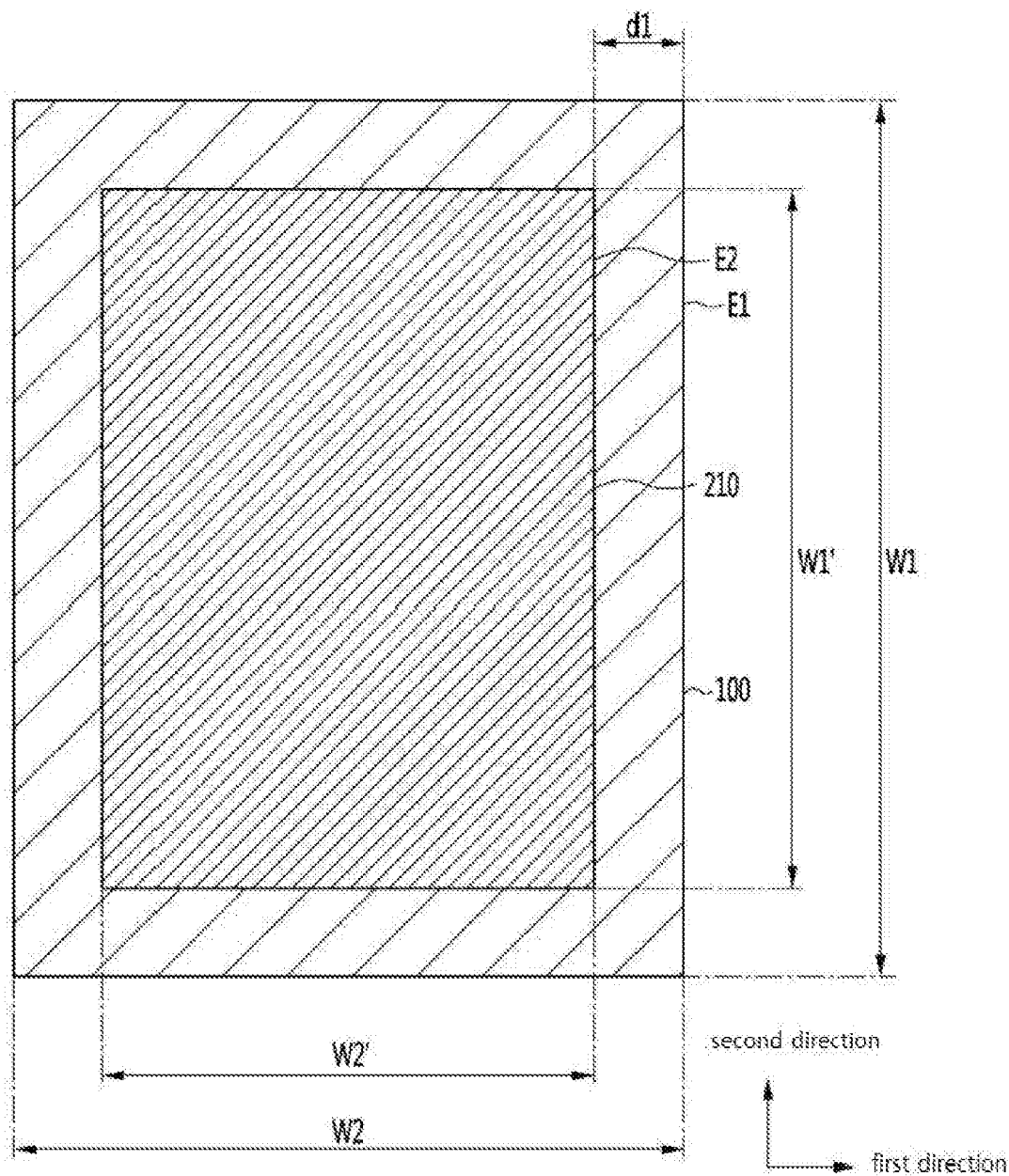

[Fig. 7]
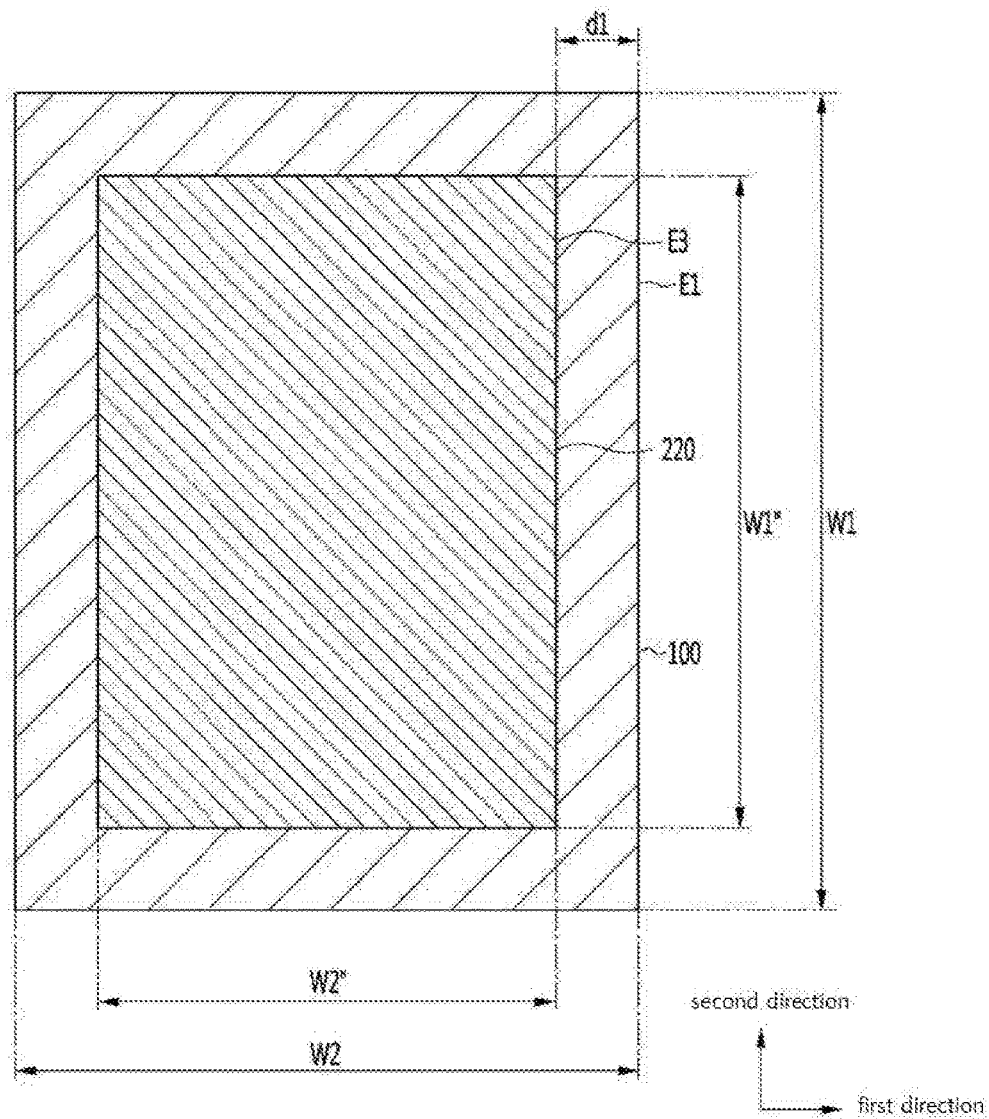
[Fig. 8]
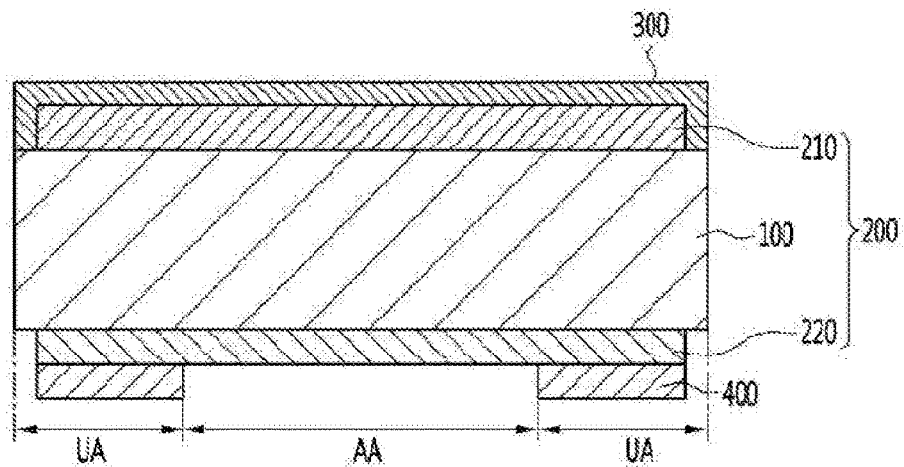

[Fig. 9]
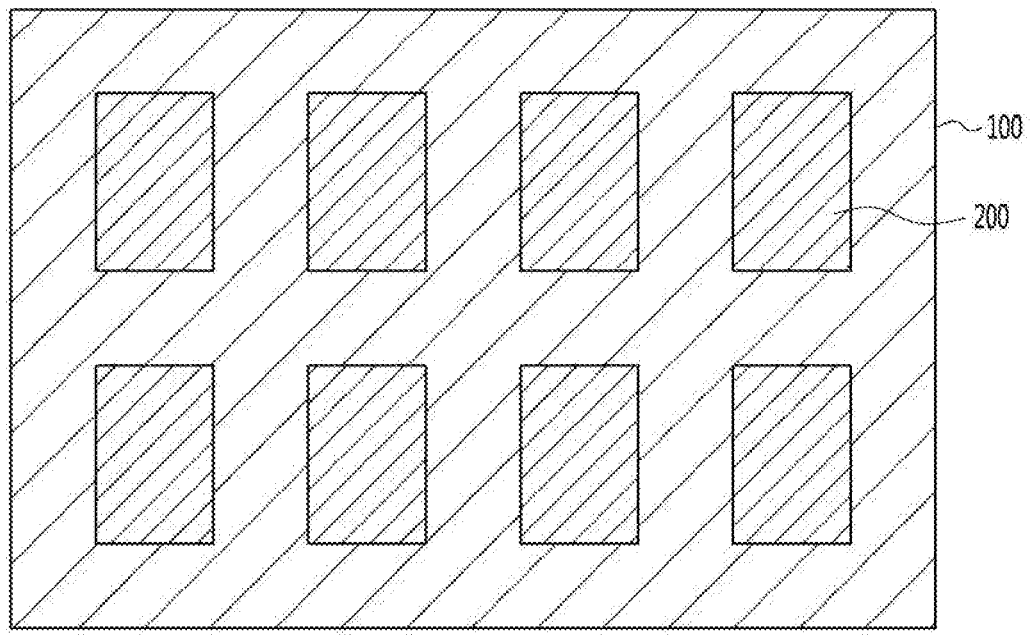
[Fig. 10]
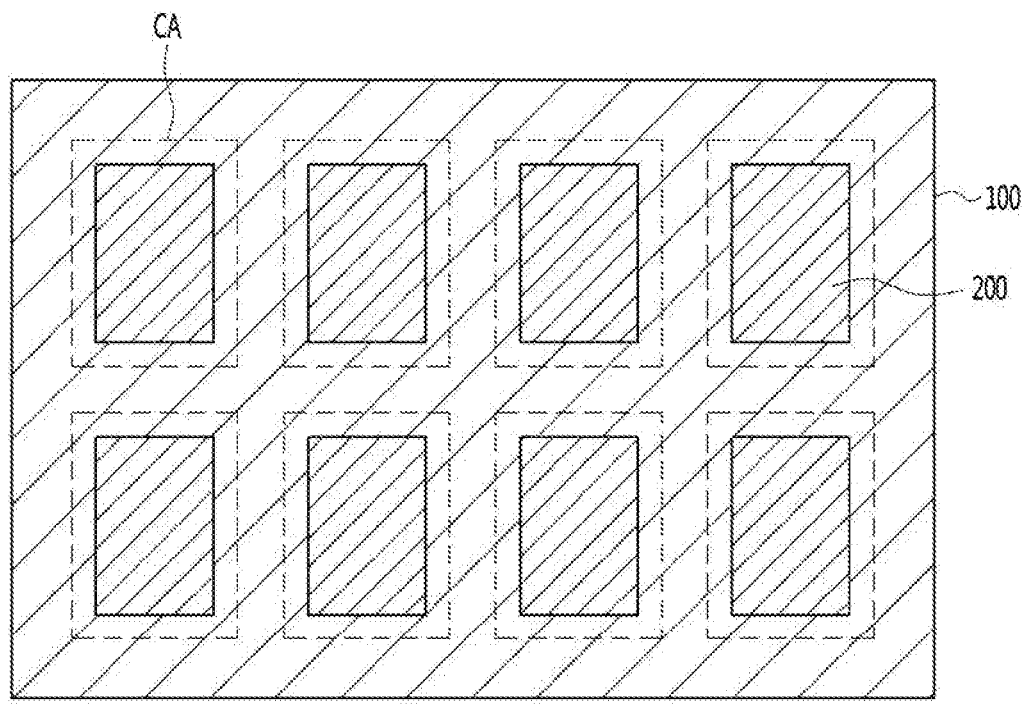

[Fig. 11]
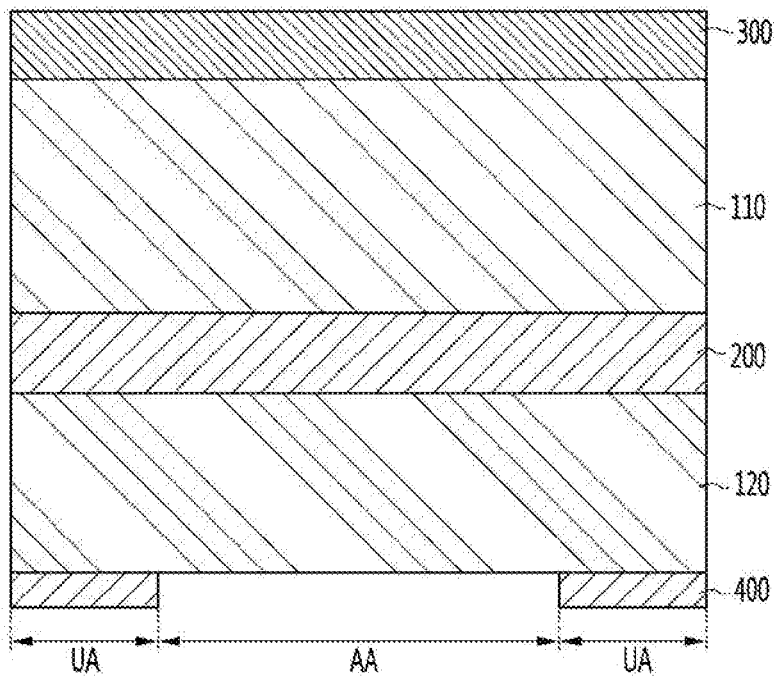
[Fig. 12]
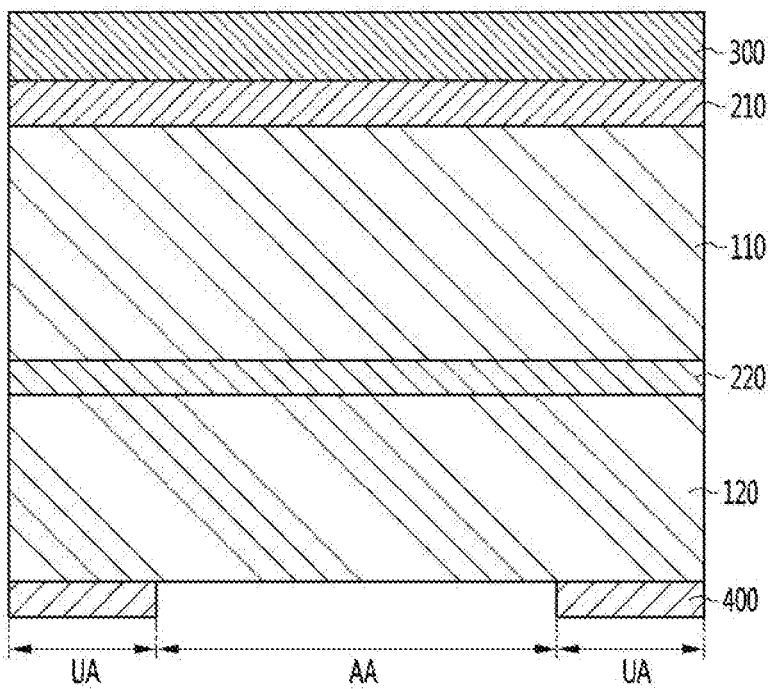

[Fig. 13]
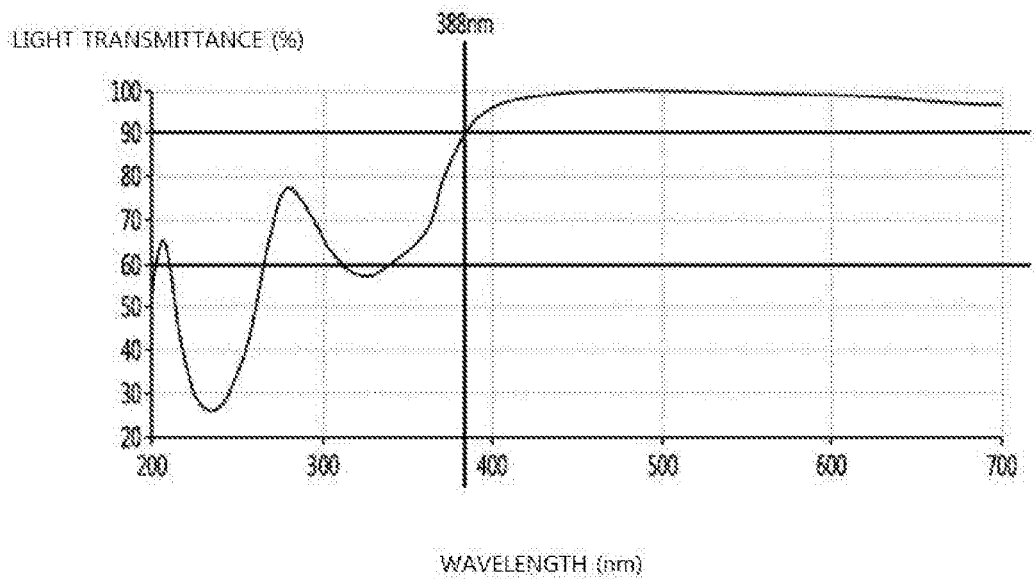
[Fig. 14]
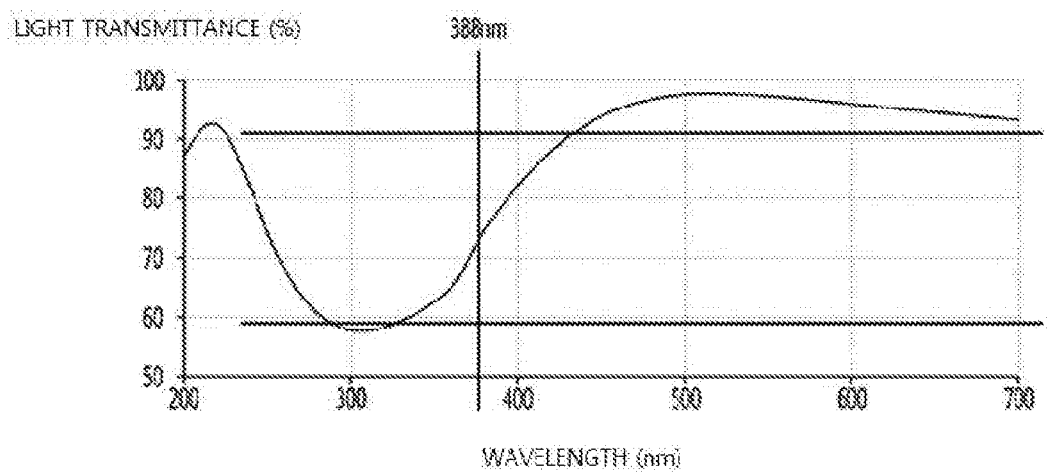

[Fig. 15]
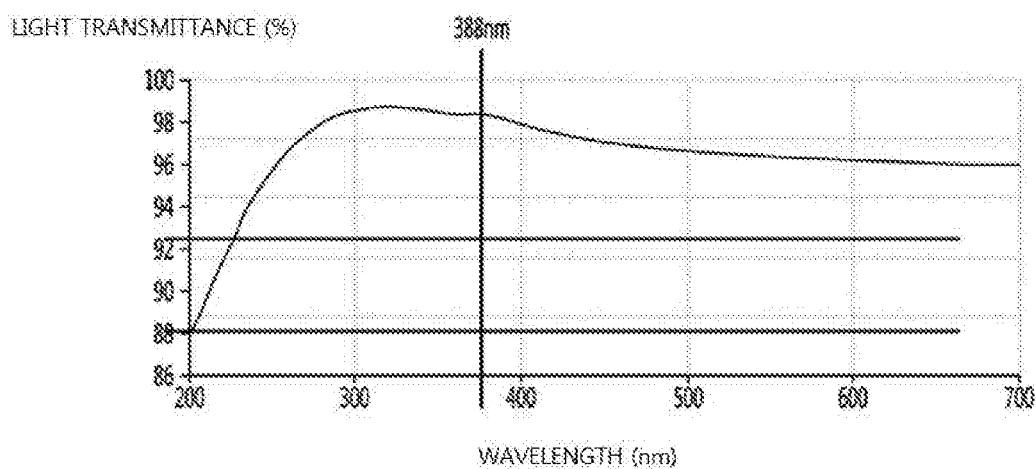
[Fig. 16]
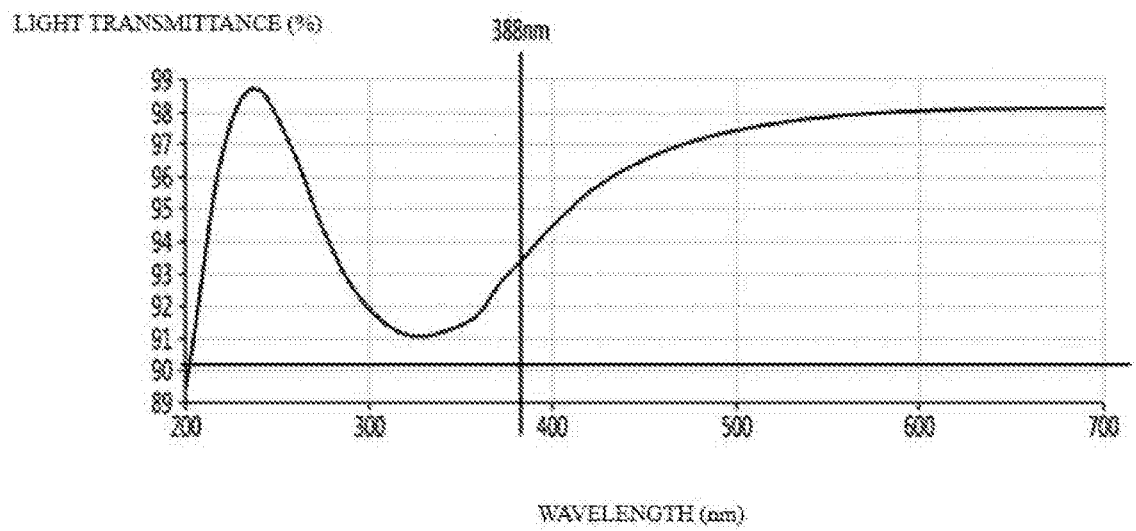

[Fig. 17]
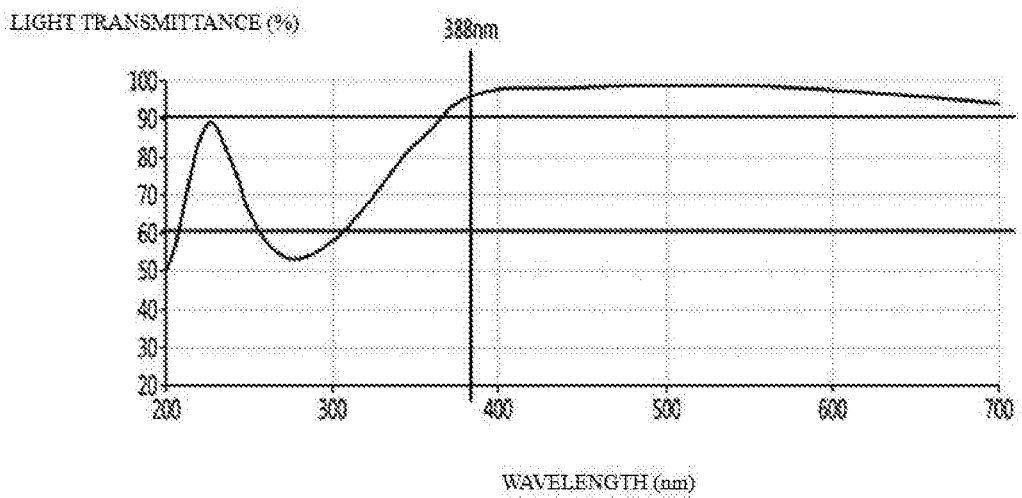
[Fig. 18]
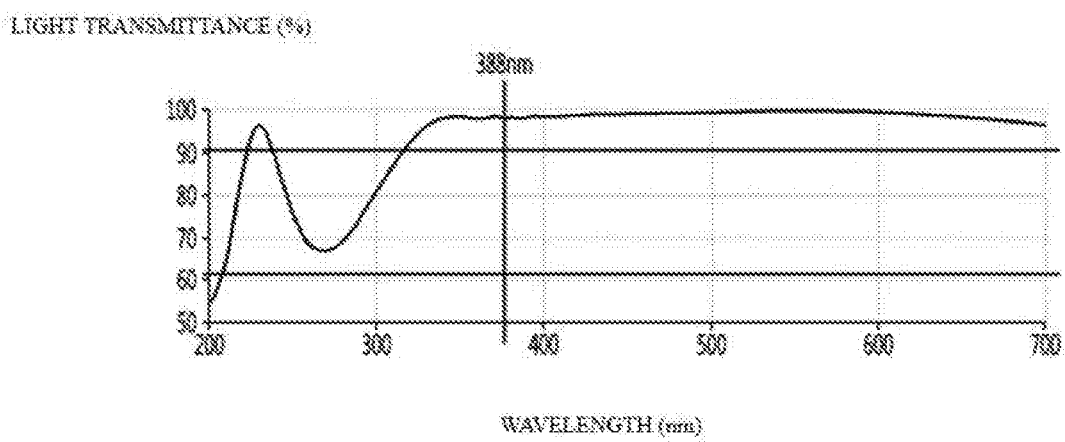
[Fig. 19]
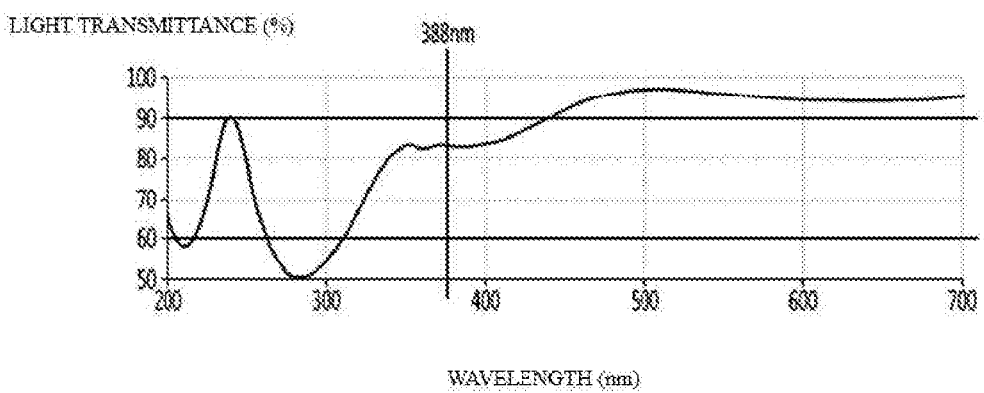

[Fig. 20]
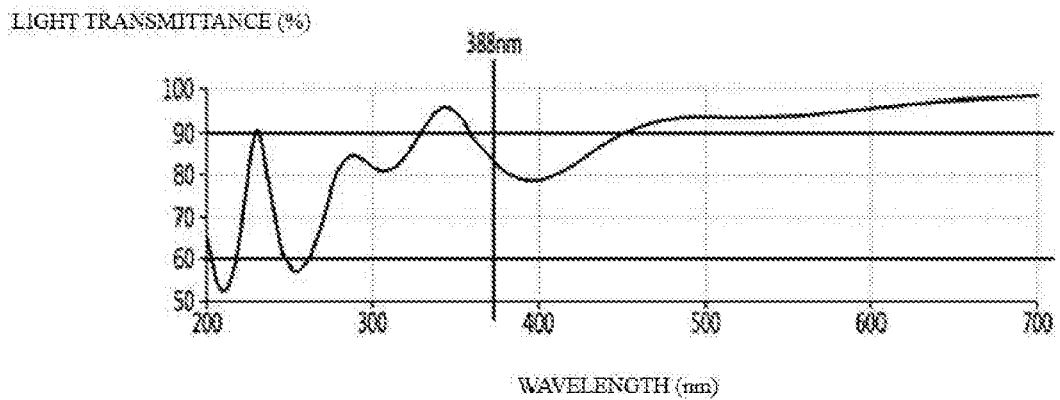
[Fig. 21]
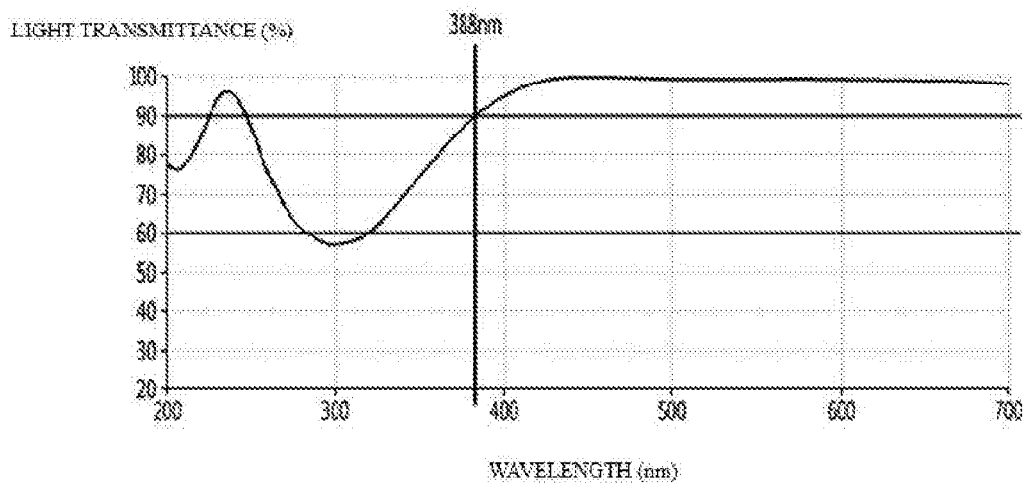
[Fig. 22]
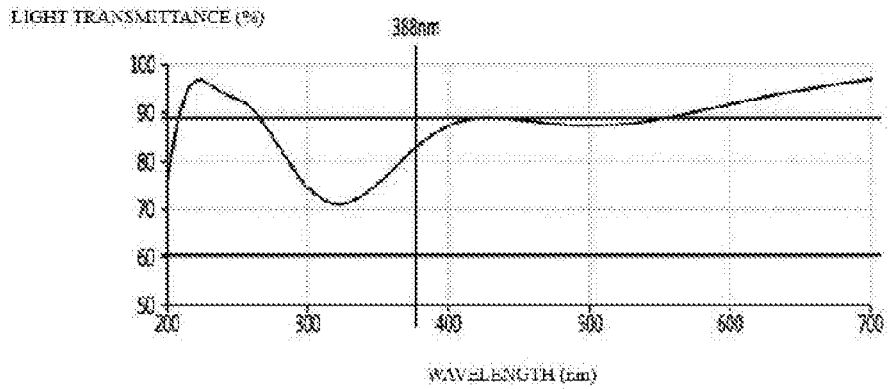

[Fig. 23]
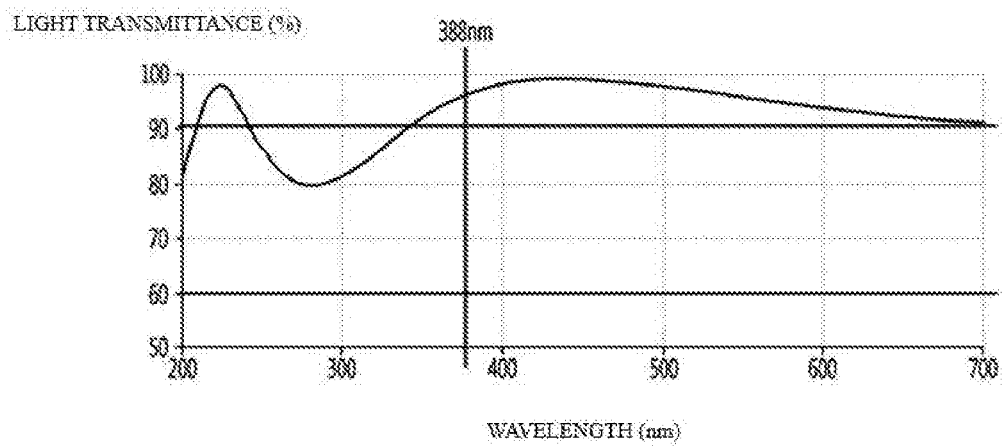
[Fig. 24]
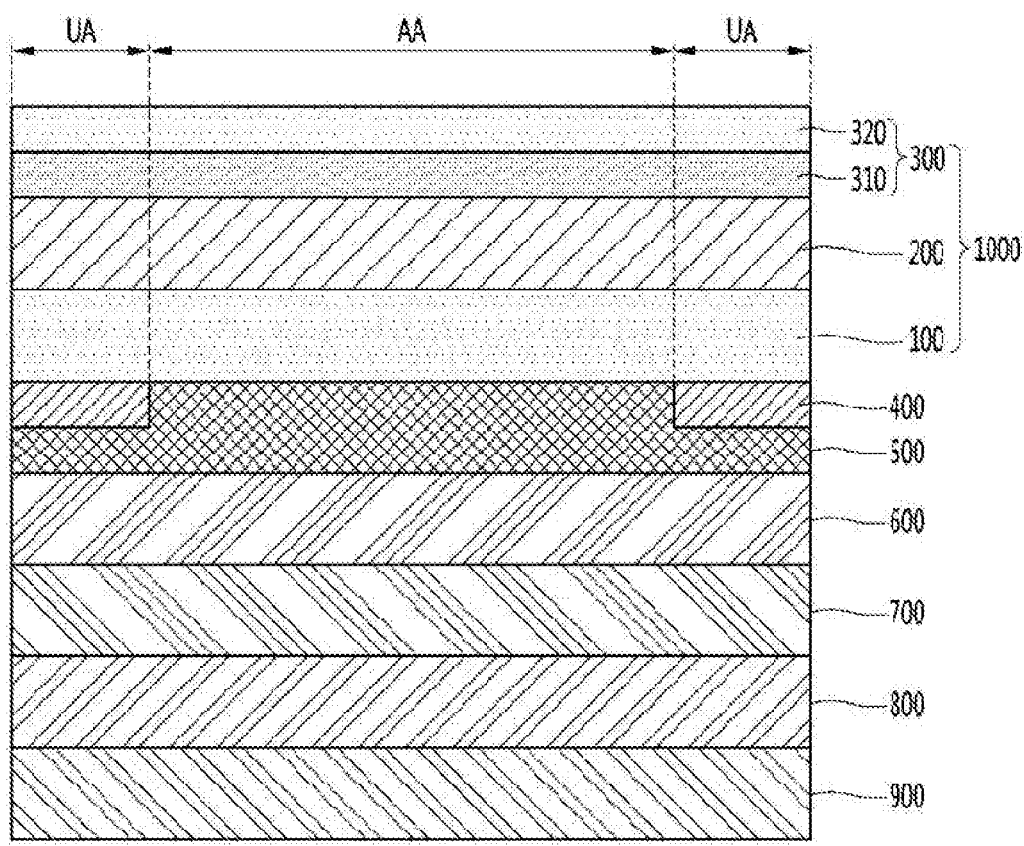

[Fig. 25]
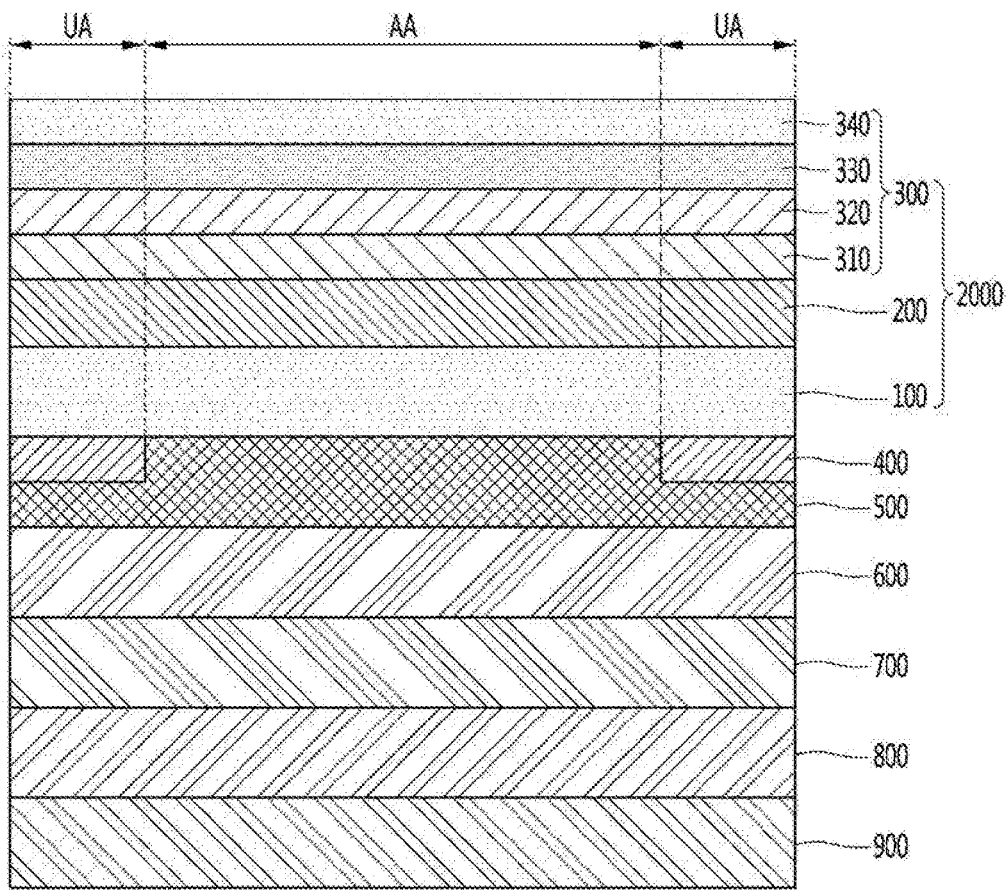
[Fig. 26]
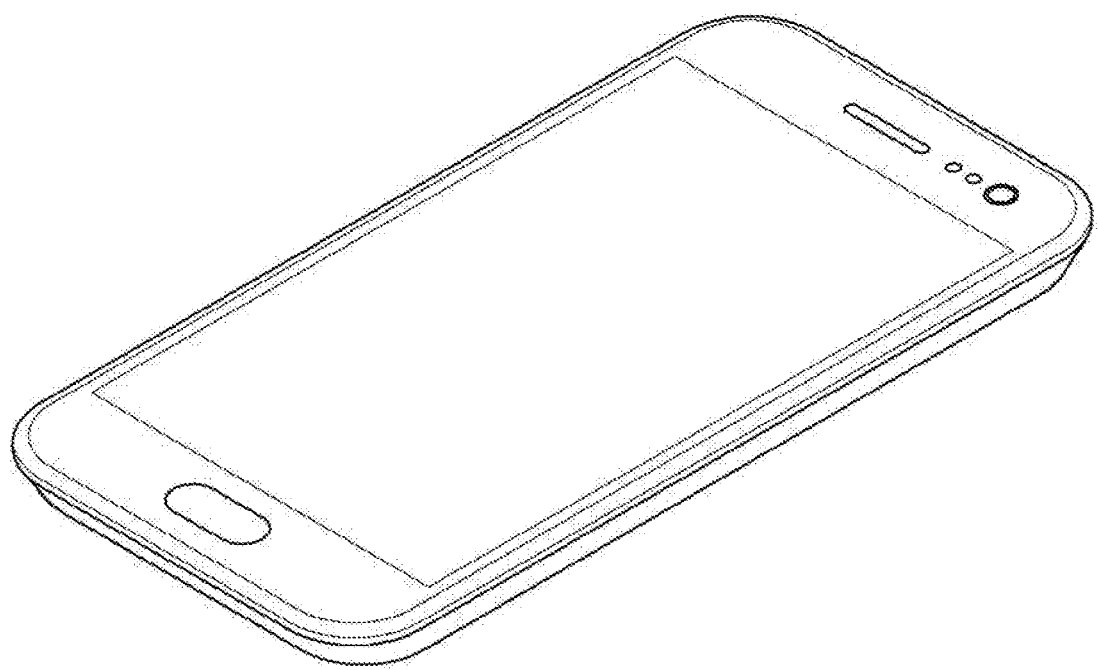

[Fig. 27]
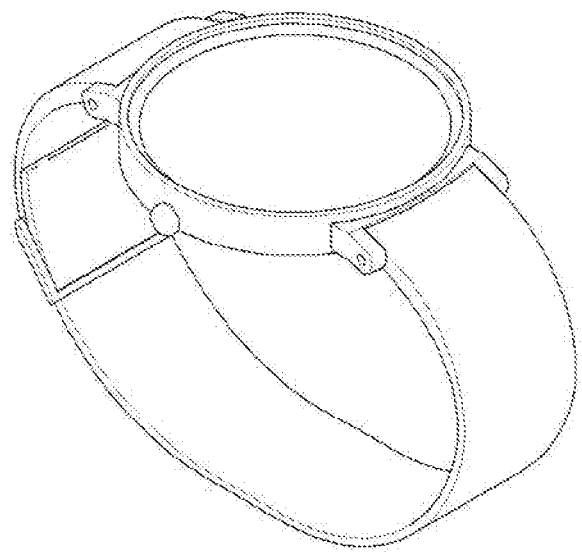

DISPLAY COVER SUBSTRATE AND DISPLAY DEVICE INCLUDING SAME

CROSS REFERENCE TO RELATED APPLICATIONS

This application is the National Phase of PCT International Application No. PCT/KR2017/014666, filed on Dec. 13, 2017, which claims priority under 35 U.S.C. 119(a) to Patent Application No. 10-2016-0172302, filed in the Republic of Korea on Dec. 16, 2016 and Patent Application No. 10-2017-0017425, filed in the Republic of Korea on Feb. 8, 2017, all of which are hereby expressly incorporated by reference into the present application.

TECHNICAL FIELD

Embodiments relate to a display cover substrate and a display device including the same.

BACKGROUND ART

Recently, a bendable display device has been applied to various electronic appliances. For example, there is an increasing interest in display devices that are bent in at least one direction and foldable.

For example, when such a flexible display device is folded in half, it can be used in a smartphone, and when a screen is unfolded, it can be applied to an IT device which can be used as a tablet, an electronic book which can be unfolded horizontally like a paper book, and the like.

Since such flexible display devices can be folded or bent, there is a need to properly control the flexible features and hardness.

In particular, in the case of flexible display devices, it may be important to reduce a thickness for bending.

Although it is possible to use an organic electroluminescent display panel to reduce the thickness of such a flexible display device, such an organic electroluminescent display panel is vulnerable to ultraviolet light (UV) introduced from the outside.

Therefore, a cover substrate of a new structure and a display device including the same that can solve the above-described problem is required.

DISCLOSURE

Technical Problem

An embodiment is directed to providing a display cover substrate having improved reliability and a display device including the same.

Technical Solution

A display cover substrate according to an embodiment includes: a flexible substrate including one surface and the other surface opposite to the one surface; a surface reinforcing layer disposed on the one surface; and a functional layer disposed on the surface reinforcing layer, wherein the functional layer includes a plurality of layers having different refractive indexes, and an average light transmittance is 90% or more in a light wavelength band of 388 nm to 700 nm, and an average light transmittance is less than 90% and a minimum light transmittance is 60% or less in a light wavelength band of 250 nm to 388 nm.

Advantageous Effects

A display cover substrate according to an embodiment can have improved strength and reliability.

Specifically, in the display cover substrate according to the embodiment, it is possible to have improved strength by disposing a surface reinforcing layer disposed on at least one of one surface and the other surface of a flexible substrate to improve the hardness of the display cover substrate.

In addition, the display cover substrate according to the embodiment can reduce a light transmittance in a specific wavelength region of light incident from the outside by disposing multiple functional layers on the surface reinforcing layer.

Specifically, the display cover substrate according to the embodiment can reduce a transmittance of UV light in a light wavelength band of about 388 nm or less.

Accordingly, when the display cover substrate according to the embodiment is applied to a display device, it is possible to reduce the incidence of UV light into a display panel disposed under the display cover substrate.

Thus, it is possible to prevent a self-luminous element disposed inside the display panel from being damaged or deformed by the ultraviolet rays, thereby improving the reliability and lifetime of the display device.

DESCRIPTION OF DRAWINGS

FIG. 1 is a cross-sectional view illustrating a display cover substrate according to a first embodiment.

FIG. 2 is another cross-sectional view illustrating the display cover substrate according to the first embodiment.

FIG. 3 is a cross-sectional view illustrating a display cover substrate according to a second embodiment.

FIG. 4 is a cross-sectional view illustrating a display cover substrate according to a third embodiment.

FIG. 5 is a cross-sectional view illustrating a display cover substrate according to a fourth embodiment.

FIGS. 6 and 7 are top and bottom views illustrating a display cover substrate according to an embodiment.

FIG. 8 is another cross-sectional view illustrating the display cover substrate according to the fourth embodiment.

FIGS. 9 and 10 are views for explaining a manufacturing process of a display cover substrate according to an embodiment.

FIG. 11 is a cross-sectional view illustrating a display cover substrate according to a fifth embodiment.

FIG. 12 is a cross-sectional view illustrating a display cover substrate according to a sixth embodiment.

FIGS. 13 to 16 are graphs for explaining a light transmittance of a display cover substrate according to the first embodiment and a comparative example.

FIGS. 17 to 20 are graphs for explaining a light transmittance of a display cover substrate according to the second embodiment and a comparative example.

FIGS. 21 to 23 are graphs for explaining a light transmittance of a display cover substrate according to the third embodiment and a comparative example.

FIG. 24 is a cross-sectional view illustrating a display device to which a cover window according to the first embodiment is applied.

FIG. 25 is a cross-sectional view illustrating a display device to which a cover window according to the first and third embodiments is applied.

FIGS. 26 and 27 are views illustrating an example of a touch device appliance to which a display cover substrate according to embodiments is applied.

MODES OF THE INVENTION

In the description of embodiments, when it is described that each layer (film), region, pattern, or structure is formed "above/on" or "below/under" a substrate, each layer (film), region, pad or pattern, the description includes those formed both "directly" or via another layer. A standard of above/on or below/under of each layer will be described based on the drawings.

Also, when a part is referred to as being "connected" to another part, it includes not only "directly connected" but also "indirectly connected" with another member therebetween. Also, when a part is referred to as "including" an element, it means that the part may include other elements as well without excluding the other elements unless specifically stated otherwise.

In the drawings, the thickness or the size of each layer (film), region, pattern or structure may be modified for clarity and convenience of explanation, and thus does not entirely reflect the actual size.

Hereinafter, a display cover substrate according to embodiments will be described with reference to the drawings.

FIGS. 1 and 2, a display cover substrate 1000 according to a first embodiment may include a flexible substrate 100, a surface reinforcing layer 200, and a functional layer 300.

The flexible substrate 100 may include a transparent material. The flexible substrate 100 may include a flexible material. For example, the flexible substrate 100 may include a transparent plastic material.

For example, the flexible substrate 100 may include at least one material among polyethylene terephthalate (PET), polyethylene naphthalate (PEN), polyimide (PI), polycarbonate (PC), polystyrene (PS), polyether sulfone (PES), and silicone resin.

A thickness T1 of the flexible substrate 100 may be about 150 μm or less. Specifically, the thickness T1 of the flexible substrate 100 may be about 20 μm to about 150 μm. More specifically, the thickness T1 of the flexible substrate 100 may be about 30 μm to about 50 μm.

When the thickness T1 of the flexible substrate 100 is less than about 20 μm, the overall strength of a cover window may be lowered and reliability of a display device to which the cover window is applied may be deteriorated.

In addition, when the thickness T1 of the flexible substrate 100 exceeds about 150 μm, cracks may occur in the flexible substrate when the display device to which the cover window is applied is bent in one direction according to the thickness of the flexible substrate 100, and thus the reliability of the display device may be deteriorated.

The flexible substrate 100 may include one surface and the other surface. For example, the flexible substrate 100 may include the one surface and the other side opposite to each other.

Referring to FIG. 1, the surface reinforcing layer 200 may be disposed on the flexible substrate 100. Specifically, the surface reinforcing layer 200 may be disposed on the one surface of the flexible substrate 100.

The surface reinforcing layer 200 may be disposed in direct or indirect contact with the one surface of the flexible substrate 100.

Alternatively, referring to FIG. 2, the surface reinforcing layer 200 may be disposed on the one surface and the other surface of the flexible substrate 100. Specifically, the surface reinforcing layer 200 includes a first surface reinforcing layer 210 disposed on the one surface of the flexible substrate 100 and a second surface reinforcing layer 220 disposed on the other surface of the flexible substrate 100.

The surface reinforcing layer 200 may include a resin composition. Specifically, the surface reinforcing layer 200 may be formed by coating the resin composition on the one surface of the flexible substrate 100, respectively. That is, the surface reinforcing layer 200 may be defined as a hard coating layer coated on the one surface of the flexible substrate.

The resin composition may include a resin material, a photoinitiator, a cross-linkable monomer, and an additive. Specifically, the resin material, the photoinitiator, the cross-linkable monomer, and the additive may be mixed with a solvent such as propylene glycol monomethyl ether (PGME) to form the resin composition.

The resin material may include at least one resin material of a photocurable resin having a cross-linkable functional group and a thermosetting resin. For example, the resin material may include at least one resin material of an acrylic resin and a urethane-based resin.

In addition, the photo initiator may include a photoinitiator material that cures the cross-linkable functional group.

In addition, the resin composition may include a cross-linkable monomer. For example, the resin composition may further include a cross-linkable monomer having at least one functional group of an acrylate group, an epoxy group and an oxetane group. The hardness of the reinforcing layer may be improved by the cross-linkable monomer.

Further, the resin composition may further include an additive. For example, the resin composition may further include silica particles ($SiO_2$). The silica particles may be dispersed and disposed in the resin composition.

The hardness of the surface reinforcing layer may be improved by the silica particles.

The silica particles may have a particle size of nano unit. The silica particles may have a particle size of about 20 nm or less. Specifically, the silica particles may have a particle size of about 1 nm to 15 nm or less. More specifically, the silica particles may have a particle size of about 5 nm to 10 nm or less.

When the particle size of the silica particles exceeds about 20 nm, dispersibility of the silica particles may be lowered.

The silica particles may be contained at about 10 wt % to 65 wt % of the entire resin composition. Specifically, the silica particles may be contained at about 30 wt % to 65 wt % of the entire resin composition. When the silica particles are contained at less than about 10 wt %, the hardness of the surface reinforcing layer may be lowered. In addition, when the silica particles are contained at more than about 65 wt %, the hardness may be improved, but a bending property is lowered, and cracks may occur in the surface reinforcing layer when the cover substrate is bent.

A thickness T2 of the surface reinforcing layer 200 may be about 20 μm or less. Specifically, the thickness T2 of the surface reinforcing layer 200 may be about 5 μm to about 20 μm. More specifically, the thickness T2 of the surface reinforcing layer 200 may be about 10 μm to about 15 μm.

When the thickness T2 of the surface reinforcing layer 200 is less than about 5 μm, the surface reinforcing layer 200 may not effectively protect the flexible substrate from external impacts. When the thickness T2 of the surface reinforcing layer 200 is greater than about 15 μm, cracks may occur in the cover substrate when the display device to which the cover substrate is applied is bent in one direction by the thickness of the surface reinforcing layer 200, and thus reliability of the display device may be deteriorated.

In addition, a thickness T2a of the first surface reinforcing layer 210 and a thickness T2b of the second surface reinforcing layer 220 may be the same or similar.

For example, the thickness T2a of the first surface reinforcing layer 210 and the thickness T2b of the second surface reinforcing layer 220 may be about 5 μm to about 20 μm, a difference between the thickness T2a of the first surface reinforcing layer 210 and the thickness T2b of the second surface reinforcing layer 220 may be about 5 μm or less.

When the difference between the thickness T2a of the first surface reinforcing layer 210 and the thickness T2b of the second surface reinforcing layer 220 exceeds about 5 μm, the flexible substrate 100 has different hardness characteristics on one surface and the other surface therein, and thus cracks may occur in any one of the first surface reinforcing layer 210 and the second surface reinforcing layer 220 when the cover substrate is bent.

Hardness of an upper surface of the display cover substrate according to an embodiment including the flexible substrate 100 may be about 7 H or more by the surface reinforcing layer 200.

Accordingly, the cover substrate according to the embodiment and the display device including the same may be protected from an external impact by the surface reinforcing layer, thereby improving reliability of the cover substrate and the display device including the same.

The functional layer 300 may be disposed on the flexible substrate 100. Specifically, the functional layer 300 may be disposed on one surface of the flexible substrate 100. Specifically, the functional layer 300 may be disposed on the surface reinforcing layer 200 on one surface of the flexible substrate 100.

The functional layer 300 may be disposed on the surface reinforcing layer 200 to control light incident from the outside. In particular, the functional layer 300 may prevent reflection of light incident from the outside, thereby increasing the transmittance. That is, the functional layer may be an anti-reflection layer.

In addition, the functional layer 300 may control light transmittance of a specific wavelength band of light incident from the outside. For example, the functional layer 300 may reduce the light transmittance in an ultraviolet (UV) wavelength band of light incident from the outside. That is, the functional layer may be a UV blocking layer.

That is, the functional layer 300 may be an anti-reflection-ultraviolet blocking layer.

Further, although not shown in the drawings, an additional functional layer may be further disposed on the functional layer 300. Specifically, a fingerprint blocking layer may be further disposed on the functional layer 300. Specifically, a fingerprint blocking layer including a fluorine compound may be disposed on the functional layer 300.

The functional layer 300 may include at least one layer. Specifically, the functional layer 300 may include a plurality of layers. That is, the functional layer 300 may be formed in multiple layers.

Referring to FIGS. 1 and 2, the functional layer 300 may include a first layer 310 and a second layer 320. Specifically, the functional layer 300 may include the first layer 310 on the surface reinforcing layer 200 and the second layer 320 on the first layer 310.

The first layer 310 and the second layer 320 may include an oxide. The first layer 310 and the second layer 320 may include different materials. The first layer 310 and the second layer 320 may include different oxides.

For example, the first layer 310 may include titanium dioxide ($TiO_2$) or zirconium dioxide ($ZrO_2$). In addition, the second layer 320 may include silicon dioxide ($SiO_2$).

The first layer 310 and the second layer 320 may have different refractive indexes. Specifically, the refractive index of the first layer 310 may be greater than that of the second layer 320.

In addition, the refractive index of the first layer 310 may be greater than that of the flexible substrate 100. In addition, the refractive index of the flexible substrate 100 may be greater than that of the second layer 320.

For example, the refractive index of the flexible substrate 100 may be about 1.5 to 1.6. In addition, the refractive index of the first layer 310 may be about 2.0 or more. In addition, the refractive index of the second layer 320 may be about 1.5 or less.

A thickness of the functional layer 300 may be about 300 nm or less. Specifically, the thickness of the functional layer 300 may be about 50 nm to about 250 nm. More specifically, the thickness of the functional layer 300 may be about 70 nm to about 200 nm.

When the thickness of the functional layer 300 is more than about 300 nm, a crack may occur in the cover substrate when the display device to which the cover substrate is applied is bent in one direction by the thickness of the functional layer 300. Thus, the reliability of the display device may be deteriorated.

Thicknesses of the first layer 310 and the second layer 320 may be different from each other. Specifically, a thickness T3a of the first layer 310 may be smaller than a thickness T3b of the second layer 320. That is, the thickness T3b of the second layer 320 may be greater than the thickness T3a of the first layer 310.

For example, the thickness T3a of the first layer 310 may be about 1 nm to about 25 nm. In addition, the thickness T3b of the second layer 320 may be about 80 nm to about 120 nm. A size ratio of the thickness T3a of the first layer 310 to the thickness T3b of the second layer 320 may be about 3.2 to 120.

When the thickness T3a of the first layer 310 and the thickness T3b of the second layer 320 are out of the range and the size ratio, a light transmittance in a light wavelength band of 388 nm or less may be increased. Accordingly, the display panel or the like disposed under the cover substrate may be damaged or deformed by UV light or the like of 388 nm or less, and thus the overall reliability and lifetime of the display device may be deteriorated.

In addition, a light transmittance in a light wavelength band of 388 nm or more may be drastically reduced. Accordingly, a problem that light emitted from the display is not sufficiently transmitted and the display device may not provide clear image quality may occur.

Hereinafter, a display cover substrate according to a second embodiment will be described with reference to FIGS. 3 and 4. In the description of the display cover substrate according to the second embodiment, description which is the same as or similar to that of the above-described display cover substrate according to the first embodiment will be omitted, and the same reference numerals are assigned to the same components.

Referring to FIGS. 3 and 4, a display cover substrate 2000 according to the second embodiment may include a flexible substrate 100, a surface reinforcing layer 200, and a functional layer 300.

In the display cover substrate 2000 according to the second embodiment, the functional layer 300 may include a third layer 330 and a fourth layer 340, unlike the display cover substrate according to the first embodiment.

Specifically, the functional layer 300 includes a first layer 310 on the surface reinforcing layer 200, a second layer 320 on the first layer 310, the third layer 330 on the second layer 320, and the fourth layer 340 on the third layer 330.

The first layer 310, the second layer 320, the third layer 330, and the fourth layer 340 may include an oxide. The first layer 310, the second layer 320, the third layer 330, and the fourth layer 340 may include different materials. The first layer 310, the second layer 320, the third layer 330, and the fourth layer 340 may include different oxides.

For example, the first layer 310 and the third layer 330 may include at least one material of titanium dioxide ($TiO_2$) and zirconium dioxide ($ZrO_2$). In addition, the second layer 320 and the fourth layer 340 may include silicon dioxide ($SiO_2$).

The first layer 310, the second layer 320, the third layer 330, and the fourth layer 340 may have different refractive indexes. Specifically, the refractive indexes of the first layer 310 and the third layer 330 may be greater than those of the second layer 320 and the fourth layer 340.

In addition, the refractive indexes of the first layer 310 and the third layer 330 may be greater than that of the flexible substrate 100. In addition, the refractive index of the flexible substrate 100 may be greater than those of the second layer 320 and the fourth layer 340.

For example, the refractive index of the flexible substrate 100 may be about 1.5 to 1.6. In addition, the refractive indexes of the first layer 310 and the third layer 330 may be about 2.0 or more. The refractive indexes of the first layer 310 and the third layer 330 may be the same or different within the range. In addition, the refractive indexes of the second layer 320 and the fourth layer 340 may be about 1.5 or less. The refractive indexes of the second layer 320 and the fourth layer 340 may be the same or different within the range.

A thickness of the functional layer 300 may be about 300 nm or less. Specifically, the thickness of the functional layer 300 may be about 50 nm to about 250 nm. More specifically, the thickness of the functional layer 300 may be about 70 nm to about 200 nm.

When the thickness of the functional layer 300 is more than about 300 nm, a crack may occur in the cover substrate when the display device to which the cover substrate is applied is bent in one direction by the thickness of the functional layer 300. Thus, the reliability of the display device may be deteriorated.

Thicknesses of the first layer 310, the second layer 320, the third layer 330, and the fourth layer 340 may be different from each other.

Specifically, a thickness T3b of the second layer 320 may be greater than a thickness T3a of the first layer 310. In addition, a thickness T3c of the third layer 330 may be greater than the thickness T3b of the second layer 320. Further, a thickness T3d of the fourth layer 340 may be greater than the thickness T3c of the third layer 330.

Alternatively, the thickness T3b of the second layer 320 may be greater than the thickness T3a of the first layer 310. In addition, the thickness T3c of the third layer 330 may be greater than the thickness T3b of the second layer 320. Further, the thickness T3d of the fourth layer 340 may be smaller than the thickness T3c of the third layer 330.

For example, the thickness T3a of the first layer 310 may be about 10 nm to about 25 nm. In addition, the thickness T3b of the second layer 320 may be about 10 nm to about 50 nm. Further, the thickness T3c of the third layer 330 may be about 110 nm to about 200 nm. Furthermore, the thickness T3d of the fourth layer 340 may be about 25 nm to about 110 nm.

Alternatively, the thickness T3a of the first layer 310 may be about 10 nm to about 50 nm. In addition, the thickness T3b of the second layer 320 may be about 10 nm to about 50 nm. Further, the thickness T3c of the third layer 330 may be about 40 nm to about 70 nm. Furthermore, the thickness T3d of the fourth layer 340 may be about 60 nm to about 120 nm.

When the thicknesses of the first layer 310, the second layer 320, the third layer 330, and the fourth layer 340 are out of the range and the size ratio, a light transmittance in a light wavelength band of 388 nm or less may be increased. Accordingly, the display panel or the like disposed under the cover substrate may be damaged or deformed by UV light or the like of 388 nm or less, and thus the overall reliability and lifetime of the display device may be deteriorated.

In addition, a light transmittance in a light wavelength band of 388 nm or more may be drastically reduced. Accordingly, a problem that light emitted from the display is not sufficiently transmitted and the display device may not provide clear image quality may occur.

Meanwhile, the flexible substrate 100 and the surface reinforcing layer 200, or the flexible substrate 100, the first surface reinforcing layers 210, and the second surface reinforcing layers 220 are shown in the same size in FIGS. 1 to 4, but an embodiment is not limited thereto, and the flexible substrate 100 and the surface reinforcing layer 200, or the flexible substrate 100, the first surface reinforcing layers 210, and the second surface reinforcing layers 220 may have different sizes.

For example, referring to FIGS. 5 to 7, the flexible substrate 100, the first surface reinforcing layer 210, and the second surface reinforcing layer 220 may have different sizes.

Here, the size may mean a width and an area of the flexible substrate 100, the first surface reinforcing layer 210, and the second surface reinforcing layer 220.

Specifically, the width of the flexible substrate 100 may be greater than those of the first and second surface reinforcing layers 210 and 220.

For example, the flexible substrate 100 may have a first width W1 extending in a first direction and a second width W2 extending in a direction different from the first direction. In addition, the first surface reinforcing layer 210 may have a first width W1' extending in a first' direction same as the first direction and a second width W2' extending in a second' direction same as the second direction. In addition, the second surface reinforcing layer 220 may have a first width W1" extending in a first" direction same as the first direction and a second width W2" extending in a second" direction same as the second direction.

At this time, a size of the first width W1 may be greater than those of the first width W1' and the first width W1". In addition, a size of the second width W2 may be greater than those of the second width W2' and the second width W2".

In addition, an area of the flexible substrate 100 may be greater than those of the first and second surface reinforcing layers 210 and 220.

In addition, borders of the first surface reinforcing layer 210 and the second surface reinforcing layer 220, that is, edges may be disposed at an inner side than a border, that is, an edge of the flexible substrate 100.

In addition, the first surface reinforcing layer 210 and the second surface reinforcing layer 220 may be disposed such that one surface of the flexible substrate 100 adjacent to the first surface reinforcing layer 210 and the second surface reinforcing layer 220 is exposed.

In addition, an area of a region in which the flexible substrate 100 and the first surface reinforcing layer 210 are overlapped may be larger than an area of a region in which the flexible substrate 100 and the first surface reinforcing layer 210 are not overlapped. In addition, an area of a region in which the flexible substrate 100 and the second surface reinforcing layer 220 are overlapped may be larger than an area of a region in which the flexible substrate 100 and the second surface reinforcing layer 220 are not overlapped.

In addition, the area of the region in which the flexible substrate 100 and the first surface reinforcing layer 210 are overlapped may be smaller than the area of the flexible substrate 100. In addition, the area of the region in which the flexible substrate 100 and the second surface reinforcing layer 220 are overlapped may be smaller than the area of the flexible substrate 100.

In addition, an area of a region in which the flexible substrate 100 and the first surface reinforcing layer 210 are in contact may be larger than an area of a region in which the flexible substrate 100 and the first surface reinforcing layer 210 are in not contact. In addition, an area of a region in which the flexible substrate 100 and the second surface reinforcing layer 220 are in contact may be larger than an area of a region in which the flexible substrate 100 and the second surface reinforcing layer 220 are not in contact.

In addition, the area of the region in which the flexible substrate 100 and the first surface reinforcing layer 210 are in contact may be smaller than the area of the flexible substrate 100. In addition, the area of the region in which the flexible substrate 100 and the second surface reinforcing layer 220 are in contact may be smaller than the area of the flexible substrate 100.

The flexible substrate 100, the first surface reinforcing layer 210, and the second surface reinforcing layer 220 may include a plurality of edges in which the respective surfaces meet.

For example, the flexible substrate 100, the first surface reinforcing layer 210, and the second surface reinforcing layer 220 may be formed in a hexahedral shape including six faces, and each may include twelve edges. For example, the flexible substrate 100 may include a first edge E1, and the first surface reinforcing layer 210 may include a second edge E2 facing the first edge E1. At this time, the second edge E2 may be disposed at an inner side than the first edge E1.

In addition, the flexible substrate 100 may include the first edge E1, and the second surface reinforcing layer 220 may include a third edge E3 facing the first edge E1. At this time, the third edge E3 may be disposed at an inner side than the first edge E1.

In addition, the second edge E2 and the third edge E3 may be located on an ineffective region of the flexible substrate 100.

That is, an end of the flexible substrate 100 may protrude more than ends of the first surface reinforcing layer 210 and the second surface reinforcing layer 220.

Accordingly, positions of the end of the flexible substrate 100 and the ends of the first surface reinforcing layer 210 and the second surface reinforcing layer 220 may be different from each other.

In addition, the first surface reinforcing layer 210 and the second surface reinforcing layer 220 may be partially disposed on upper and lower surfaces of the flexible substrate 100.

Since the flexible substrate 100 and the first surface reinforcing layer 210, and the flexible substrate 100 and the second surface reinforcing layer 220 have different sizes, a step may be formed by thicknesses of the first surface reinforcing layer 210 and the second surface reinforcing layer 220.

The first edge E1 and the second edge E2, and the first edge E1 and the third edge E3 may be spaced apart from each other by a predetermined distance.

Here, the first edge E1 may be defined as a edge of a side surface of the flexible substrate 100, and the second edge E2 may be defined as a edge of a side surface of the first surface reinforcing layer 210 extending in the same direction as the side surface of the flexible substrate 100 and/or a side surface of the second surface reinforcing layer 220, and the third edge E3 may be defined as a edge of the side surface of the second surface reinforcing layer 220 extending in the same direction as the side surface of the flexible substrate 100 and/or the side surface of the first surface reinforcing layer 210.

A first distance d1 between the first edge E1 and the second edge E2 and/or a second distance d2 between the first edge E1 and the third edge E3 may be about 300 µm or less. Specifically, the first distance d1 between the first edge E1 and the second edge E2 and/or the second distance d2 between the first edge E1 and the third edge E3 may be about 10 µm to about 300 µm.

When the first distance d1 and/or the second distance d2 are/is less than about 10 µm, when the cover substrate is cut in cell units, the surface reinforcing layer is peeled from the flexible substrate by a cutting process, so that reliability of the cover substrate may be deteriorated. In addition, when the first distance d1 or the second distance d2 exceeds about 300 µm, a contact area between the surface reinforcing layer and the flexible substrate is reduced, so that a strength of an outer region of the flexible substrate may be lowered and a strength of the cover substrate as a whole may be lowered.

The sizes of the first surface reinforcing layer 210 and the second surface reinforcing layer 220 may be the same or different.

For example, the sizes of the first width W1' and the second width W2' and the first width W1" and the second width W2" may be the same or different.

For example, the size of the first' width W1' may be greater than the size of the first" width W1" and/or the size of the second' width W2' may be greater than the size of the second" width W2".

The flexible substrate 100 may include an effective region AA and an ineffective region UA. A display may be displayed in the effective region AA and the display may not be displayed in the ineffective region UA disposed around the effective region AA.

The first surface reinforcing layer 210 may be disposed on the effective region AA and the ineffective region UA of the flexible substrate 100. In addition, the second surface reinforcing layer 220 may be disposed on the effective region AA of the flexible substrate 100.

A decoration layer 400 may be disposed on a region overlapped with the ineffective region UA in a lower surface of the flexible substrate 100, that is, in the lower surface of the flexible substrate 100 in which the second surface reinforcing layer 220 is disposed.

That is, the second surface reinforcing layer 220 may be disposed on the effective region AA on the other surface of the flexible substrate 100, and the decoration layer 400 may be disposed on the ineffective region UA. That is, the second surface reinforcing layer 220 and the decoration layer 400 may be disposed in direct contact with the other surface of the flexible substrate 100.

The decoration layer 400 may be formed by applying a material having a predetermined color so that a wiring electrode disposed on the ineffective region and a printed circuit board and the like connecting the wiring electrode to an external circuit may not be seen from outside.

The second surface reinforcing layer 220 and the decoration layer 400 may be disposed in contact with each other. Specifically, the side surface of the second surface reinforcing layer 220 and a side surface of the decoration layer 400 may be disposed in contact with each other.

The thickness of the second surface reinforcing layer 220 and a thickness of the decoration layer 400 may be the same as or similar to each other. For example, the thickness of the second surface reinforcing layer 220 and the thickness of the decoration layer 400 may be equal to each other, or a difference between the thickness of the second surface reinforcing layer 220 and the thickness of the decoration layer 400 may be about 1 μm or less. Accordingly, a step according to a difference in thickness between the second surface reinforcing layer 220 and the decoration layer 400 may be reduced.

Accordingly, when an adhesive layer is disposed to adhere other members on the second surface reinforcing layer 220 and the decoration layer 400, it is possible to prevent an inflow of an air layer or the like due to the step according to the difference in thickness between the second surface reinforcing layer 220 and the decoration layer 400, thereby improving the reliability of the cover substrate.

The functional layer 300 may be disposed in contact with the first surface reinforcing layer 210. Specifically, the functional layer 300 may be disposed to surround the first surface reinforcing layer 210. That is, the functional layer 300 may contact the side surface and an upper surface of the first surface reinforcing layer 210, and may be disposed to surround the first surface reinforcing layer 210.

The functional layer 300 may surround the side surface and the upper surface of the first surface reinforcing layer 210, and may be disposed in contact with an upper surface of the flexible substrate 100.

The flexible substrate 100 may include a region in which the first surface reinforcing layer 210 is disposed and a region in which the first surface reinforcing layer 210 is not disposed, and the functional layer 300 may be disposed in contact with the upper surface of the flexible substrate on which the first surface reinforcing layer 210 is not disposed.

FIG. 8 is a cross-sectional view of a cover substrate according to another embodiment.

In the description of the cover substrate according to another embodiment, description which is the same as or similar to that of the above-described cover substrate according to the embodiment will be omitted, and the same reference numerals are assigned to the same components.

Referring to FIG. 8, in the cover substrate according to another embodiment. a decoration layer 400 may be disposed on the second surface reinforcing layer 220, unlike the cover substrate according to the embodiment of FIG. 5 described above.

Specifically, a second surface reinforcing layer 220 may be disposed on a lower surface of the flexible substrate 100.

The second surface reinforcing layer 220 may be disposed on an effective region AA and an ineffective region UA of the flexible substrate 100.

In addition, the decoration layer 400 may be disposed on the second surface reinforcing layer 220. Specifically, the decoration layer 400 may be disposed on a position corresponding to the ineffective region UA on the second surface reinforcing layer 220.

Hereinafter, a manufacturing process of a cover substrate according to an embodiment will be described with reference to FIGS. 9 and 10.

Referring to FIG. 9, a surface reinforcing layer 200 may be disposed on one surface of the flexible substrate 100. Specifically, the surface reinforcing layer 200 may be disposed at a position corresponding to each of cells of the flexible substrate 100 to be cut. That is, the surface reinforcing layer 200 may be disposed in a plurality of patterns.

Referring to FIG. 10, the flexible substrate 100 may be cut. Specifically, it is possible to cut the region in which the surface reinforcing layers 200 are disposed in units of cells. Specifically, the flexible substrate 100 may be pressured to cut with a jig or cut by using a laser. At this time, a cut region CA may be formed outside the surface reinforcing layer 200. That is, an area of the cut region CA may be larger than that of the surface reinforcing layer 200. Therefore, when cutting the flexible substrate 100, it is possible to prevent pressure due to pressure of the jig, or heat of the laser, and the like from being directly transmitted to the surface reinforcing layer 200.

Specifically, when heat is directly transferred to the surface reinforcing layer including a resin material by heat generated during the cutting process, an internal molecular structure of the surface reinforcing layer may be changed, and accordingly, a size of the voids inside the surface reinforcing layer may be increased. Adhesion between the inside of the surface reinforcing layer and the flexible substrate is deteriorated due to such voids, so that delamination may be generated. In addition, when a heat or pressure process is performed, impurities may be introduced into the surface reinforcing layer, thereby deteriorating bending and strength characteristics of the surface reinforcing layer.

However, in the cover substrate according to an embodiment, it is possible to prevent cracks from occurring in the surface reinforcing layer 200 or the surface reinforcing layer 200 from being delaminated from the flexible substrate during the cutting process by forming and cutting the cut region CA outside the surface reinforcing layer.

Hereinafter, a cover substrate according to still another embodiment will be described with reference to FIGS. 11 and 12.

FIGS. 11 and 12 are cross-sectional views illustrating a cover substrate according to still another embodiment. In the description of the cover substrate according to still another embodiment, description which is the same as or similar to that of the above-described cover substrate according to the embodiment will be omitted, and the same reference numerals are assigned to the same components.

Referring to FIG. 11, the cover substrate according to still another embodiment may include a first flexible substrate 110, a second flexible substrate 120, a surface reinforcing layer 200, and a functional layer 300.

Specifically, the first flexible substrate 110 may include one surface and another surface opposite to the one surface.

The functional layer 300 may be disposed on the one surface of the first flexible substrate 110. The surface reinforcing layer 200 may be disposed on the other surface of the first flexible substrate 110.

The surface reinforcing layer 200 may be disposed on an effective region AA and an ineffective region UA of the first flexible substrate 110.

The second flexible substrate 120 may be disposed on the surface reinforcing layer 200. In addition, a decoration layer 400 may be disposed on the second flexible substrate 120.

Accordingly, the surface reinforcing layer 200 may be disposed between the first flexible substrate 110 and the second flexible substrate 120. That is, one surface and the other surface of the surface reinforcing layer 200 are both disposed in contact with the flexible substrate, and may not be exposed to the outside.

Accordingly, when manufacturing the cover substrate, it is possible to prevent heat and impact generated during the cutting process from being transmitted to the surface reinforcing layer by the first and second flexible substrates.

Therefore, it is possible to prevent deformation of characteristics of the surface reinforcing layer, generation of a crack, or delamination from the flexible substrate by preventing the heat and impact generated during the cutting process from being directly transferred to the surface reinforcing layer.

Referring to FIG. 12, the cover substrate according to still another embodiment may include a first flexible substrate 110, a second flexible substrate 120, a first surface reinforcing layer 210, a second surface reinforcing layer 220, and a functional layer 300.

Referring to FIG. 12, the first surface reinforcing layer 210 and the second surface reinforcing layer 220 may be included, unlike in FIG. 11.

Specifically, the first surface reinforcing layer 210 may be disposed on one surface of the first flexible substrate 110. The functional layer 300 may be disposed on the first surface reinforcing layer 210.

In addition, the second surface reinforcing layer 220 may be disposed on the other surface of the first flexible substrate 110. The second flexible substrate 120 may be disposed on the other surface of the second surface reinforcing layer 220. Further, a decoration layer 400 may be disposed on the second flexible substrate 120.

Accordingly, the second surface reinforcing layer 220 may be disposed between the first flexible substrate 110 and the second flexible substrate 120. That is, one surface and the other surface of the second surface reinforcing layer 220 are both disposed in contact with the flexible substrate, and may not be exposed to the outside.

Accordingly, when manufacturing the cover substrate, it is possible to prevent heat and impact generated during the cutting process from being transmitted to the second surface reinforcing layer by the first and second flexible substrates.

Therefore, it is possible to prevent deformation of characteristics of the surface reinforcing layer, generation of a crack, or delamination from the flexible substrate by preventing the heat and impact generated during the cutting process from being directly transferred to the surface reinforcing layer.

Hereinafter, the present invention will be described in more detail with reference to display cover substrates according to embodiments and comparative examples. These embodiments are merely illustrative in order to explain the present invention in more detail. Therefore, the present invention is not limited to these embodiments.

Exemplary Embodiment 1

A surface reinforcing layer containing an acrylic resin was coated on a substrate containing polyimide.

Subsequently, a first layer containing titanium dioxide was disposed on the surface reinforcing layer, and a second layer containing silicon dioxide was disposed on the first layer to manufacture a display cover substrate.

At this time, a thickness of the first layer was 1 nm to 25 nm, and a thickness of the second layer was 80 nm to 120 nm.

Then, hardness of the display cover substrate and a light transmittance by a wavelength band were measured.

Comparative Example 1

A display cover substrate was manufactured in the same manner as Exemplary Embodiment 1 except that a thickness of a first layer was 30 nm and a thickness of a second layer was 100 nm, and hardness of the display cover substrate and a light transmittance by a wavelength band were measured.

Comparative Example 2

A display cover substrate was manufactured in the same manner as Exemplary Embodiment 1 except that a thickness of a first layer was 3 nm and a thickness of a second layer was 70 nm, and hardness of the display cover substrate and a light transmittance by a wavelength band were measured.

Comparative Example 3

A display cover substrate was manufactured in the same manner as Exemplary Embodiment 1 except that a thickness of a first layer was 3 nm and a thickness of a second layer was 130 nm, and hardness of the display cover substrate and a light transmittance by a wavelength band were measured.

TABLE 1

| | Exemplary Embodiment 1 | Comparative Example 1 | Comparative Example 2 | Comparative Example 3 |
|---|---|---|---|---|
| Hardness (H) | 7H | 7H | 7H | 7H |

Referring to Table 1 and FIGS. 13 to 16, it can be seen that the hardness of the display cover substrate according to Exemplary Embodiment 1 has a high hardness of about 7 H or more.

In addition, referring to FIGS. 13 to 16, it can be seen that the display cover substrate according to Exemplary Embodiment 1 has a lower light transmittance in the ultraviolet wavelength band and a higher light transmittance in the visible light wavelength band than the display cover substrates according to Comparative Examples 1 to 3.

Specifically, referring to FIG. 13, it can be seen that the display cover substrate according to Exemplary Embodiment 1 has a light transmittance of about 90% or more in a visible light wavelength band of 388 nm to 700 nm.

That is, it can be seen that the display cover substrate according to Exemplary Embodiment 1 may reduce reflection of light by the functional layer, and thus has an overall improved light transmittance.

In addition, it can be seen that the display cover substrate according to Exemplary Embodiment 1 has an average light transmittance of less than 90% and a minimum light transmittance of less than 60% in an ultraviolet light wavelength band of 250 nm to 388 nm. Specifically, it can be seen that the display cover substrate according to Exemplary Embodiment 1 has a maximum light transmittance of less than 90% and a minimum light transmittance of less than 30% in an ultraviolet light wavelength band of less than 388 nm.

In particular, it can be seen that a light transmittance is the lowest in a light wavelength band of 240 nm to 340 nm.

Since most of wavelengths of 300 nm or less in the sunlight incident on the display cover substrate are scattered before reaching the atmosphere, main light in the atmosphere may be ultraviolet rays of 300 nm to 388 nm. Accordingly, when a transmittance in a wavelength range of 240 nm or less has the minimum value, or a transmittance in a wavelength range of 340 nm or more has the minimum value, ultraviolet light incident in the atmosphere may not be effectively blocked.

The display cover substrate according to an embodiment may sufficiently block the ultraviolet rays from being transmitted in the wavelength region, and effectively prevent light of the wavelength region from being incident in a direction of display panel when the display cover substrate is applied to a display device.

That is, it can be seen that the display cover substrate according to Exemplary Embodiment 1 has a high light transmittance in a visible light wavelength band of 388 nm to 700 nm and a low light transmittance in an ultraviolet light wavelength band of less than 388 nm.

On the other hand, referring to FIG. 14, it can be seen that the display cover substrate according to Comparative Example 1 has a light transmittance of less than 90% in a visible light wavelength band of 388 to 700 nm, and referring to FIGS. 15 and 16, it can be seen that the display cover substrates according to Comparative Examples 2 and 3 have a light transmittance of 90% or more in a light wavelength band of 240 nm to 340 nm.

That is, the display cover substrates according to Comparative Examples 1 to 3 have a higher light transmittance in the ultraviolet light wavelength band of less than 388 nm, and a lower light transmittance in the visible light wavelength band of 388 nm to 700 nm.

That is, it can be seen that the display cover substrates according to Comparative Examples 1 to 3 transmit less visible light and transmit more ultraviolet light than the display cover substrate according to Exemplary Embodiment 1.

Exemplary Embodiment 2

A surface reinforcing layer containing an acrylic resin was coated on a substrate containing polyimide.

Subsequently, a first layer containing titanium dioxide was disposed on the surface reinforcing layer, a second layer containing silicon dioxide was disposed on the first layer, a third layer containing zirconium dioxide was disposed on the second layer, and a fourth layer containing silicon dioxide was disposed on the third layer to manufacture a display cover substrate.

At this time, a thickness of the first layer was 10 nm to 25 nm, a thickness of the second layer was 10 nm to 50 nm, a thickness of the third layer was 110 nm to 200 nm, and a thickness of the fourth layer was 25 nm to 110 nm.

Then, hardness of the display cover substrate and a light transmittance by a wavelength band were measured.

Comparative Example 4

A display cover substrate was manufactured in the same manner as Exemplary Embodiment 2 except that a thickness of a first layer was 7.5 nm, a thickness of a second layer was 33 nm, a third layer was 113 nm, and a thickness of a fourth layer was 76 nm, and hardness of the display cover substrate and a light transmittance by a wavelength band were measured.

Comparative Example 5

A display cover substrate was manufactured in the same manner as Exemplary Embodiment 2 except that a thickness of a first layer was 30 nm, a thickness of a second layer was 33 nm, a third layer was 113 nm, and a thickness of a fourth layer was 76 nm, and hardness of the display cover substrate and a light transmittance by a wavelength band were measured.

Comparative Example 6

A display cover substrate was manufactured in the same manner as Exemplary Embodiment 2 except that a thickness of a first layer was 15 nm, a thickness of a second layer was 33 nm, a third layer was 164 nm, and a thickness of a fourth layer was 152 nm, and hardness of the display cover substrate and a light transmittance by a wavelength band were measured.

TABLE 2

| | Exemplary Embodiment 2 | Comparative Example 4 | Comparative Example 5 | Comparative Example 6 |
| --- | --- | --- | --- | --- |
| Hardness (H) | 7H | 7H | 7H | 7H |

Referring to Table 2 and FIGS. 17 to 20, it can be seen that the hardness of the display cover substrate according to Exemplary Embodiment 2 has a high hardness of about 7 H or more.

In addition, referring to FIGS. 17 to 20, it can be seen that the display cover substrate according to Exemplary Embodiment 2 has a lower light transmittance in the ultraviolet wavelength band and a higher light transmittance in the visible light wavelength band than the display cover substrates according to Comparative Examples 4 to 6.

Specifically, referring to FIG. 17, it can be seen that the display cover substrate according to Exemplary Embodiment 2 has a light transmittance of about 90% or more in a visible light wavelength band of 388 nm to 700 nm.

That is, it can be seen that the display cover substrate according to Exemplary Embodiment 2 may reduce reflection of light by the functional layer, and thus has an overall improved light transmittance.

In addition, it can be seen that the display cover substrate according to Exemplary Embodiment 2 has a minimum light transmittance of less than 60% in an ultraviolet light wavelength band of 250 nm to 388 nm.

In particular, it can be seen that a light transmittance is the lowest in a light wavelength band of 240 nm to 340 nm.

That is, it can be seen that the display cover substrate according to Exemplary Embodiment 2 has a high light transmittance in a visible light wavelength band of 388 nm to 700 nm and a low light transmittance in an ultraviolet light wavelength band of less than 388 nm.

On the other hand, referring to FIG. 18, it can be seen that the display cover substrate according to Comparative Examples 4 has a light transmittance of 60% or more in an ultraviolet light wavelength band of less than 388 nm, and referring to FIGS. 19 and 20, it can be seen that the display cover substrates according to Comparative Examples 5 and 6 have a light transmittance of less than 90% in a visible light wavelength band of 388 nm to 700 nm.

That is, the display cover substrates according to Comparative Examples 4 to 6 have a higher light transmittance in the ultraviolet light wavelength band of less than 388 nm, and a lower light transmittance in the visible light wavelength band of 388 nm to 700 nm.

That is, it can be seen that the display cover substrates according to Comparative Examples 4 to 6 transmit less visible light and transmit more ultraviolet light than the display cover substrate according to Exemplary Embodiment 2.

Exemplary Embodiment 3

A surface reinforcing layer containing an acrylic resin was coated on a substrate containing polyimide.

Subsequently, a first layer containing zirconium dioxide was disposed on the surface reinforcing layer, a second layer containing silicon dioxide was disposed on the first layer, a third layer containing zirconium dioxide was disposed on the second layer, and a fourth layer containing silicon dioxide was disposed on the third layer to manufacture a display cover substrate.

At this time, a thickness of the first layer was 10 nm to 50 nm, a thickness of the second layer was 10 nm to 50 nm, a thickness of the third layer was 40 nm to 70 nm, and a thickness of the fourth layer was 60 nm to 120 nm.

Then, hardness of the display cover substrate and a light transmittance by a wavelength band were measured.

Comparative Example 7

A display cover substrate was manufactured in the same manner as Exemplary Embodiment 3 except that a thickness of a first layer was 59 nm, a thickness of a second layer was 33 nm, a third layer was 56 nm, and a thickness of a fourth layer was 75 nm, and hardness of the display cover substrate and a light transmittance by a wavelength band were measured.

Comparative Example 8

A display cover substrate was manufactured in the same manner as Exemplary Embodiment 3 except that a thickness of a first layer was 7.5 nm, a thickness of a second layer was 33 nm, a third layer was 56 nm, and a thickness of a fourth layer was 75 nm, and hardness of the display cover substrate and a light transmittance by a wavelength band were measured

TABLE 3

|  | Exemplary Embodiment 3 | Comparative Example 7 | Comparative Example 8 |
| --- | --- | --- | --- |
| Hardness (H) | 7H | 7H | 7H |

Referring to Table 3 and FIGS. 21 to 23, it can be seen that the hardness of the display cover substrate according to Exemplary Embodiment 3 has a high hardness of about 7 H or more.

In addition, referring to FIGS. 21 to 23, it can be seen that the display cover substrate according to Exemplary Embodiment 3 has a lower light transmittance in the ultraviolet wavelength band and a higher light transmittance in the visible light wavelength band than the display cover substrates according to Comparative Examples 7 to 8.

Specifically, referring to FIG. 21, it can be seen that the display cover substrate according to Exemplary Embodiment 3 has a light transmittance of about 90% or more in a visible light wavelength band of 388 nm to 700 nm.

That is, it can be seen that the display cover substrate according to Exemplary Embodiment 3 may reduce reflection of light by the functional layer, and thus has an overall improved light transmittance.

In addition, it can be seen that the display cover substrate according to Exemplary Embodiment 3 has a minimum light transmittance of less than 60% in an ultraviolet light wavelength band of 250 nm to 388 nm.

In particular, it can be seen that a light transmittance is the lowest in a light wavelength band of 240 nm to 340 nm.

That is, it can be seen that the display cover substrate according to Exemplary Embodiment 3 has a high light transmittance in a visible light wavelength band of 388 nm to 700 nm and a low light transmittance in an ultraviolet light wavelength band of less than 388 nm.

On the other hand, referring to FIG. 22, it can be seen that the display cover substrate according to Comparative Examples 7 has a light transmittance of 60% or more in an ultraviolet light wavelength band of less than 388 nm, and a light transmittance of less than 90% in a visible light wavelength band of 388 nm to 700 nm, and referring to FIG. 18, it can be seen that the display cover substrate according to Comparative Examples 8 has a light transmittance of 60% or more in the ultraviolet light wavelength band of less than 388 nm.

That is, the display cover substrates according to Comparative Examples 7 to 8 have a higher light transmittance in the ultraviolet light wavelength band of less than 388 nm, and a lower light transmittance in the visible light wavelength band of 388 nm to 700 nm.

That is, it can be seen that the display cover substrates according to Comparative Examples 7 to 8 transmit less visible light and transmit more ultraviolet light than the display cover substrate according to Exemplary Embodiment 3.

Hereinafter, a display device including the display cover substrate according to the above-described embodiments will be described with reference to FIGS. 24 and 25. In the description of the display device according to an embodiment, description which is the same as or similar to that of the above-described cover substrate according to the embodiment will be omitted, and the same reference numerals are assigned to the same components.

Referring to FIGS. 17 and 18, a display device according to an embodiment may include cover substrates 1000 and 2000, a decoration layer 400 and a reinforcing layer 500 disposed under the cover substrates 1000 and 2000, a polarizing layer 600 and a touch panel 700 disposed under the reinforcing layer 500, an adhesive layer 800 disposed under the touch panel 700, and a display panel 900 disposed under the adhesive layer 800.

FIG. 17 is a view for explaining a display device including the cover substrate of FIG. 1 described above, and FIG. 18 is a view for explaining a display device including the cover substrate of FIG. 3 described above.

The cover substrate 1000 or 2000 may include an effective region AA and an ineffective region UA. A display may be displayed in the effective region AA and the display may not be displayed in the ineffective region UA disposed around the effective region AA.

The decoration layer 400 may be disposed under the cover substrate 1000 or 2000. Specifically, the decoration layer 400 may be disposed on the ineffective region UA. Specifically, the decoration layer 400 may be disposed in contact with the cover substrate 1000 or 2000 on the ineffective region UA.

The decoration layer 400 may be formed by applying a material having a predetermined color so that a wiring electrode disposed on the ineffective region and a printed circuit board and the like connecting the wiring electrode to an external circuit may not be seen from outside.

The decoration layer 400 may have a color suitable for a desired appearance. For example, the decoration layer 400 may include black or white pigment to represent black or white. Alternatively, various color films may be used to display various colors such as red, blue, and the like.

In addition, a desired logo or the like may be formed on the decoration layer 400 by various methods. The decoration layer 400 may be formed by deposition, printing, wet coating, or the like.

The decoration layer 400 may be disposed in at least one layer. For example, the decoration layer 400 may be disposed in one layer or in at least two layers having different widths.

The reinforcing layer 500 may be disposed under the cover substrate 1000 or 2000. Specifically, the reinforcing layer 500 may be disposed on the effective region AA and the ineffective region UA. Specifically, the reinforcing layer 500 may be disposed in contact with the cover substrate 1000 or 2000 on the effective region AA, and in contact with the decoration layer 400 on the ineffective region UA.

The reinforcing layer 500 may flatten lower surfaces of the cover substrates 1000 and 2000 on which the decoration layer 400 is disposed. That is, the reinforcing layer 500 may be disposed to surround the decoration layer at the lower surfaces of the cover substrates 1000 and 2000, thereby removing a step corresponding to the decoration layer. That is, the reinforcing layer 500 may be a planarization layer.

A polarizing layer 600 and a touch panel 700 may be disposed under the reinforcing layer 500.

The polarizing layer 600 may be a polarizing film. The polarizing layer 600 may be a colored film. For example, the polarizing layer 600 may be a black film. A thickness of the polarizing layer 600 may be about 5 μm or less. Specifically, the thickness of the polarizing layer 600 may be about 2 μm or less.

The polarizing layer 600 may include an alignment layer and a liquid crystal dye layer on the alignment layer. The liquid crystal dye layer is composed of liquid crystal molecules having two dyes having different colors. Since the liquid crystal molecules in the liquid crystal dye layer have dichroism, they may have a function of absorbing light vibrating in the stretching direction and transmitting light vibrating in the vertical direction. In addition, a dichroic dye contained in the liquid crystal dye layer may include iodine.

A touch panel 700 may be disposed under the polarizing layer 600. The touch panel 700 may include a sensing electrode. For example, the touch panel 700 may include a first sensing electrode and a second sensing electrode that extend in directions intersecting with each other.

Accordingly, it is possible to sense a position of an input device (e.g., a finger or a stylus pen) in the effective region or the like. Specifically, when the input device such as a finger contacts a touch surface of the cover substrate 1000 or 2000, a difference in capacitance is generated by the first and second sensing electrodes at the portion in which the input device contacts, and the portion in which such a difference occurs may be detected as the touch position.

A display panel 900 may be disposed under the touch panel 700. An adhesive layer 800 may be disposed between the touch panel 700 and the display panel 900, and the touch panel 700 and the display panel 900 may be adhered to each other by the adhesive layer 800.

The display panel 900 may include a liquid crystal display panel or an organic electroluminescent display panel. For example, the display panel 900 may include an organic electroluminescent display panel.

Specifically, the display panel 900 may include an organic electroluminescent display panel including a self-luminous element not requiring a light source separately. For example, in the display panel 900, a thin film transistor may be formed on a substrate, and an organic light emitting device contacting the thin film transistor may be formed on the substrate. The organic light emitting device may include an anode, a cathode, and an organic light emitting layer formed between the anode and the cathode. The organic light emitting device may further include another substrate serving as an encapsulation substrate for encapsulation thereon.

A display cover substrate according to an embodiment may have improved strength and reliability.

Specifically, in the display cover substrate according to the embodiment, it is possible to have improved strength by disposing a surface reinforcing layer disposed on at least one of one surface and the other surface of a flexible substrate to improve the hardness of the display cover substrate.

In addition, the display cover substrate according to the embodiment can reduce a light transmittance in a specific wavelength region of light incident from the outside by disposing multiple functional layers on the surface reinforcing layer.

Specifically, the display cover substrate according to the embodiment can reduce a transmittance of UV light in a light wavelength band of about 388 nm or less.

Accordingly, when the display cover substrate according to the embodiment is applied to a display device, it is possible to reduce the incidence of UV light into a display panel disposed under the display cover substrate.

Thus, it is possible to prevent a self-luminous element disposed inside the display panel from being damaged or deformed by the ultraviolet rays, thereby improving the reliability and lifetime of the display device.

Hereinafter, an example of a display device to which the cover substrate according to the above-described embodiments is applied will be described with reference to FIGS. 26 and 27.

Referring to FIG. 26, a mobile terminal is shown as an example of a display device. The mobile terminal may include an effective region and an ineffective region. The effective region senses a touch signal by touching of a finger or the like, and a command icon pattern part and a logo may be formed in the ineffective region.

Referring to FIG. 27, in addition, the display device may include a flexible device that is bent or folded. Accordingly, the display device including the same may be a flexible device. Therefore, the user may bend or fold by hand. Such a flexible device may be applied to a wearable touch device such as a smart watch.

The characteristics, structures, effects, and the like described in the above embodiments are included in at least one embodiment of the present invention, but are not limited to only one embodiment. Furthermore, the characteristic, structure, and effect illustrated in each embodiment may be combined or modified for other embodiments by a person skilled in the art. Accordingly, it is to be understood that such combination and modification are included in the scope of the present invention.

In addition, the above description of the embodiments is merely examples and does not limit the present invention. It would be apparent to those of ordinary skill in the art that the present invention may be easily embodied in many different forms without changing the technical idea or essential features thereof. For example, elements of the exemplary embodiments described herein may be modified and realized. Also, it should be construed that differences related to such changes and applications are included in the scope of the present invention defined in the appended claims.

The invention claimed is:

1. A display cover substrate comprising:
   a flexible substrate including one surface and the other surface opposite to the one surface;
   a surface reinforcing layer disposed on the one surface; and
   a functional layer disposed on the surface reinforcing layer,
   wherein the functional layer includes a plurality of layers having different refractive indexes, and an average light transmittance is 90% or more in a light wavelength band of 388 nm to 700 nm, an average light transmittance is less than 90% and a minimum light transmittance is 60% or less in a light wavelength band of 250 nm to 388 nm, and the light transmittance is the lowest in a light wavelength band of 240 nm to 340 nm.

2. The display cover substrate of claim 1, wherein a maximum light transmittance is less than 90% in a light wavelength band of less than 388 nm, and a minimum light transmittance is less than 30% in a light wavelength band of less than 388 nm.

3. The display cover substrate of claim 1, wherein a thickness of the flexible substrate is 20 μm to 150 μm.

4. The display cover substrate of claim 1, wherein the functional layer includes a first layer on the surface reinforcing layer, and a second layer on the first layer, and
   a refractive index of the first layer is greater than that of flexible substrate, and
   a refractive index of the flexible substrate is greater than that of the second layer.

5. The display cover substrate of claim 4, wherein the refractive index of the flexible substrate is 1.5 to 1.6, the refractive index of the first layer is 2.0 or more, and the refractive index of the second layer is 1.5 or less.

6. The display cover substrate of claim 4, wherein a thickness of the first layer is 1 nm to 25 nm, and a thickness of the second layer is 80 nm to 120 nm.

7. The display cover substrate of claim 1, wherein
   the functional layer comprises a first layer on the surface reinforcing layer;
   a second layer on the first layer;
   a third layer on the second layer; and
   a fourth layer on the third layer, and
   refractive indexes of the first layer and the third layer are greater than that of the flexible substrate, and
   a refractive index of the flexible substrate is greater than those of the second layer and the fourth layer.

8. The display cover substrate of claim 7, wherein the refractive index of the flexible substrate is 1.5 to 1.6, the refractive indexes of the first layer and the third layer are 2.0 or more, and the refractive indexes of the second layer and the fourth layer are 1.5 or less.

9. The display cover substrate of claim 7, wherein a thickness of the first layer is 1 nm to 25 nm, a thickness of the second layer is 10 nm to 50 nm, a thickness of the third layer is 110 nm to 200 nm, and a thickness of the fourth layer is 25 nm to 110 nm.

10. The display cover substrate of claim 7, wherein a thickness of the first layer is 10 nm to 50 nm, a thickness of the second layer is 10 nm to 50 nm, a thickness of the third layer is 40 nm to 70 nm, and a thickness of the fourth layer is 60 nm to 120 nm.

11. The display cover substrate of claim 1, wherein the surface reinforcing layer incudes a resin composition containing silica particles, and
    wherein the silica particles have a particle size of 20 nm or less.

12. The display cover substrate of claim 11, wherein the silica particles are contained at about 10 wt % to 65 wt % of the entire resin composition.

13. The display cover substrate of claim 1, wherein a thickness of the surface reinforcing layer is 5 μm to 20 μm.

14. The display cover substrate of claim 4, wherein the first layer includes titanium dioxide ($TiO_2$) or zirconium dioxide ($ZrO_2$), and the second layer includes silicon dioxide ($SiO_2$).

15. The display cover substrate of claim 4, wherein a thickness of the first layer is different from that of the second layer, and a ratio of the thickness of the first layer to the thickness of the second layer is 3.2 to 120.

16. The display cover substrate of claim 1, wherein the surface reinforcing layer comprises a first surface reinforcing layer disposed on one surface of the flexible substrate, and a second surface reinforcing layer disposed under the other surface of the flexible substrate.

17. The display cover substrate of claim 16, wherein a difference between a thickness of the first surface reinforcing layer and a thickness of the second surface reinforcing layer is 5 μm or less.

18. The display cover substrate of claim 16, wherein a width of the flexible substrate is greater than those of the first surface reinforcing layer and the second surface reinforcing layer.

19. The display cover substrate of claim 16, wherein a distance from edges of side surfaces of the first surface reinforcing layer and the second surface reinforcing layer to an edge of a side surface of the flexible substrate is 10 μm to 300 μm.

20. The display cover substrate of claim 16, further comprising a decoration layer disposed under the other surface of the flexible substrate,
    wherein a thickness of the decoration layer corresponds to a thickness of the second surface reinforcing layer.

* * * * *